(12) United States Patent
Van Zyl

(10) Patent No.: US 11,615,943 B2
(45) Date of Patent: Mar. 28, 2023

(54) INTER-PERIOD CONTROL FOR PASSIVE POWER DISTRIBUTION OF MULTIPLE ELECTRODE INDUCTIVE PLASMA SOURCE

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 114 days.

(21) Appl. No.: 17/174,375

(22) Filed: Feb. 12, 2021

(65) Prior Publication Data
US 2021/0166917 A1 Jun. 3, 2021

Related U.S. Application Data

(63) Continuation-in-part of application No. 17/113,088, filed on Dec. 6, 2020, which is a continuation of application No. 16/028,131, filed on Jul. 5, 2018, now Pat. No. 10,861,677.

(60) Provisional application No. 62/529,963, filed on Jul. 7, 2017.

(51) Int. Cl.
*H01J 37/32* (2006.01)
*H03H 7/40* (2006.01)

(52) U.S. Cl.
CPC .. *H01J 37/32183* (2013.01); *H01J 37/32128* (2013.01); *H03H 7/40* (2013.01)

(58) Field of Classification Search
None
See application file for complete search history.

(56) References Cited

U.S. PATENT DOCUMENTS 5,325,019 A * 6/1994 Miller ............... H01J 37/32082
315/111.21
5,517,084 A 5/1996 Leung
(Continued)

FOREIGN PATENT DOCUMENTS

CN 102985996 A 3/2013
JP S61245202 A 10/1986
(Continued)

OTHER PUBLICATIONS

KIPO, "Notice of Grounds for Rejection Regarding Korean Patent Application No. 10-2020-7001574", dated May 14, 2021, p. 18, Published in: KR.
(Continued)

*Primary Examiner* — Srinivas Sathiraju
(74) *Attorney, Agent, or Firm* — Neugeboren O'Dowd PC

(57) ABSTRACT

A generator produces output such as delivered power, voltage, current, forward power etc. that follows a prescribed pattern of output versus time where the pattern repeats with a repetition period by controlling sections of the pattern based on measurements taken one or more repetition periods in the past. A variable impedance match network may control the impedance presented to a radio frequency generator while the generator produces the output that follows the prescribed pattern of output versus time where the pattern repeats with a repetition period by controlling variable impedance elements in the match during sections of the pattern based on measurements taken one or more repetition periods in the past.

20 Claims, 12 Drawing Sheets

(56) References Cited

U.S. PATENT DOCUMENTS

| | | | |
|---|---|---|---|
| 5,767,628 A | 6/1998 | Keller et al. | |
| 5,907,221 A | 5/1999 | Sato et al. | |
| 6,180,019 B1 | 1/2001 | Kazumi et al. | |
| 6,204,607 B1 | 3/2001 | Ellingboe | |
| 6,273,022 B1 | 8/2001 | Pu et al. | |
| 6,288,493 B1 | 9/2001 | Lee et al. | |
| 6,320,320 B1 | 11/2001 | Bailey, III et al. | |
| 6,388,382 B1 | 5/2002 | Doi et al. | |
| 6,463,875 B1 | 10/2002 | Chen et al. | |
| 6,507,155 B1 | 1/2003 | Barnes et al. | |
| 6,568,346 B2 | 5/2003 | Pu et al. | |
| 6,583,572 B2 | 6/2003 | Veltrop et al. | |
| 6,617,794 B2 | 9/2003 | Barnes et al. | |
| 6,633,017 B1* | 10/2003 | Drummond | H05H 1/46 |
| | | | 219/121.57 |
| 6,646,385 B2 | 11/2003 | Howald et al. | |
| 6,685,798 B1 | 2/2004 | Holland et al. | |
| 6,694,915 B1 | 2/2004 | Holland et al. | |
| 6,700,092 B2* | 3/2004 | Vona, Jr. | H01J 37/32146 |
| | | | 219/121.48 |
| 6,756,737 B2 | 6/2004 | Doi et al. | |
| 6,893,533 B2 | 5/2005 | Holland et al. | |
| 6,924,455 B1 | 8/2005 | Chen et al. | |
| 7,019,253 B2 | 3/2006 | Johnson | |
| 7,096,819 B2 | 8/2006 | Chen et al. | |
| 7,115,185 B1* | 10/2006 | Gonzalez | H01J 37/321 |
| | | | 315/111.41 |
| 7,732,759 B2 | 6/2010 | Chen et al. | |
| 7,839,223 B2 | 11/2010 | Van Zyl et al. | |
| 7,872,523 B2* | 1/2011 | Sivakumar | H03F 3/2176 |
| | | | 330/10 |
| 8,319,436 B2 | 11/2012 | Carter et al. | |
| 8,576,013 B2* | 11/2013 | Coumou | H03F 1/32 |
| | | | 330/305 |
| 8,736,377 B2* | 5/2014 | Rughoonundon | H03K 4/026 |
| | | | 330/296 |
| 8,742,669 B2* | 6/2014 | Carter | H01J 37/32183 |
| | | | 315/111.71 |
| 8,773,019 B2* | 7/2014 | Coumou | H03F 3/211 |
| | | | 315/111.21 |
| 8,847,561 B2 | 9/2014 | Karlicek et al. | |
| 8,952,765 B2* | 2/2015 | Fisk, II | H03B 5/1237 |
| | | | 330/296 |
| 9,088,267 B2* | 7/2015 | Blackburn | H03H 7/40 |
| 9,093,853 B2* | 7/2015 | Schatz | H02J 50/12 |
| 9,210,790 B2* | 12/2015 | Hoffman | H01J 37/3299 |
| 9,225,229 B2* | 12/2015 | Abe | H02M 1/08 |
| 9,294,100 B2* | 3/2016 | Van Zyl | H03L 7/26 |
| 9,355,822 B2* | 5/2016 | Yamada | H01J 37/32155 |
| 9,509,266 B2* | 11/2016 | Coumou | H03G 1/00 |
| 9,515,633 B1* | 12/2016 | Long | H03H 7/48 |
| 9,536,713 B2* | 1/2017 | Van Zyl | H01J 37/32935 |
| 9,544,987 B2* | 1/2017 | Mueller | H01J 37/32146 |
| 9,595,424 B2* | 3/2017 | Marakhtanov | H01F 38/14 |
| 9,680,217 B2* | 6/2017 | Ali | H03H 7/40 |
| 9,773,644 B2* | 9/2017 | Van Zyl | H03F 3/189 |
| 9,812,305 B2* | 11/2017 | Pelleymounter | H01J 37/3467 |
| 9,852,890 B2* | 12/2017 | Mueller | H01J 37/32174 |
| 9,947,514 B2* | 4/2018 | Radomski | H01J 37/321 |
| 9,997,325 B2* | 6/2018 | Hosch | H01J 37/32935 |
| 10,049,857 B2 | 8/2018 | Fisk, II et al. | |
| 10,109,460 B2* | 10/2018 | Liu | H01J 37/32183 |
| 10,194,518 B2* | 1/2019 | Van Zyl | H01J 37/32082 |
| 10,217,609 B2* | 2/2019 | Fisk, II | H01J 37/3299 |
| 10,504,744 B1* | 12/2019 | Yanagawa | H01L 21/31116 |
| 10,607,813 B2* | 3/2020 | Fairbairn | C23C 16/509 |
| 10,741,363 B1* | 8/2020 | Burry | H03H 11/28 |
| 10,811,228 B2 | 10/2020 | Van Zyl et al. | |
| 10,861,677 B2* | 12/2020 | Van Zyl | H03H 7/40 |
| 10,896,807 B2* | 1/2021 | Fairbairn | C23C 16/52 |
| 11,177,115 B2* | 11/2021 | Leray | H01L 21/67069 |
| 2002/0185228 A1 | 12/2002 | Chen et al. | |
| 2004/0149218 A1 | 8/2004 | Collins et al. | |
| 2005/0264218 A1 | 12/2005 | Dhindsa et al. | |
| 2007/0107844 A1* | 5/2007 | Bullock | H01J 37/32174 |
| | | | 156/345.28 |
| 2008/0179948 A1* | 7/2008 | Nagarkatti | H03F 3/195 |
| | | | 307/18 |
| 2009/0237170 A1 | 9/2009 | Van Zyl et al. | |
| 2010/0026186 A1* | 2/2010 | Forrest | H01J 37/32935 |
| | | | 315/111.21 |
| 2010/0171427 A1* | 7/2010 | Kirchmeier | G01R 21/06 |
| | | | 315/111.21 |
| 2010/0194281 A1 | 8/2010 | Carter et al. | |
| 2010/0270141 A1* | 10/2010 | Carter | H01J 37/3299 |
| | | | 422/105 |
| 2010/0276273 A1* | 11/2010 | Heckman | H01J 37/3299 |
| | | | 204/298.04 |
| 2011/0248633 A1* | 10/2011 | Nauman | C23C 14/548 |
| | | | 315/246 |
| 2012/0252141 A1 | 10/2012 | Sundararajan et al. | |
| 2013/0002136 A1 | 1/2013 | Blackburn et al. | |
| 2013/0169359 A1 | 7/2013 | Coumou | |
| 2013/0320853 A1* | 12/2013 | Carter | H01J 37/321 |
| | | | 315/111.51 |
| 2014/0239813 A1 | 8/2014 | Van Zyl et al. | |
| 2014/0306754 A1 | 10/2014 | Coumou et al. | |
| 2015/0162168 A1* | 6/2015 | Oehrlein | H01J 37/32146 |
| | | | 216/37 |
| 2015/0250046 A1 | 9/2015 | Habu | |
| 2016/0163514 A1* | 6/2016 | Fisk, II | H01J 37/32174 |
| | | | 315/111.21 |
| 2016/0276138 A1 | 9/2016 | Van Zyl | |
| 2017/0005533 A1 | 1/2017 | Zeine et al. | |
| 2017/0062187 A1* | 3/2017 | Radomski | H01J 37/321 |
| 2017/0310008 A1* | 10/2017 | White | H03H 7/40 |
| 2017/0365907 A1* | 12/2017 | Kapoor | C23C 16/505 |
| 2018/0077788 A1* | 3/2018 | Van Zyl | H01J 37/32935 |
| 2018/0167043 A1* | 6/2018 | Van Zyl | H03K 17/693 |
| 2019/0013182 A1* | 1/2019 | Van Zyl | H01J 37/32174 |
| 2019/0157040 A1* | 5/2019 | Fairbairn | C23C 16/52 |
| 2020/0043703 A1 | 2/2020 | French et al. | |
| 2020/0203128 A1* | 6/2020 | Fairbairn | H01J 37/3299 |
| 2020/0411289 A1* | 12/2020 | Radomski | H01J 37/32183 |
| 2021/0118649 A1* | 4/2021 | Huh | H01J 37/32183 |
| 2021/0118650 A1* | 4/2021 | Van Zyl | H03H 7/40 |
| 2021/0134562 A1* | 5/2021 | Fairbairn | C23C 16/509 |
| 2021/0166917 A1* | 6/2021 | Van Zyl | H03H 7/40 |
| 2021/0249228 A1* | 8/2021 | Van Zyl | H01J 37/3299 |
| 2021/0287880 A1* | 9/2021 | Van Zyl | H01J 37/32146 |

FOREIGN PATENT DOCUMENTS

| | | |
|---|---|---|
| JP | 2002184598 A | 6/2002 |
| JP | 2006-286254 A | 10/2006 |
| JP | 2007311182 A | 11/2007 |
| JP | 2008-501224 A | 1/2008 |
| JP | 2009-514176 A | 4/2009 |
| JP | 2010521041 A | 6/2010 |
| JP | 2010-219026 A | 9/2010 |
| JP | 2013176040 A | 9/2013 |
| KR | 10-2014-0000172 A | 1/2014 |
| KR | 10-2014-0130009 A | 11/2014 |
| TW | I562189 B | 12/2016 |
| TW | 201719711 A | 6/2017 |
| TW | I585814 B | 6/2017 |
| WO | 2004/012220 A2 | 2/2004 |
| WO | 2007/053569 A1 | 5/2007 |
| WO | 2019/010312 A1 | 1/2019 |
| WO | WO-2019010312 A1 * | 1/2019 ........ H01J 37/32045 |

OTHER PUBLICATIONS

First Office Action received for Chinese Patent Application Serial No. 201880045502.2 dated Oct. 11, 2021, 22 pages.

International Search Report and Written Opinion received for International PCT Application Serial No. PCT/US2022/016291 dated Apr. 27, 2022, 11 pages.

Leva et al., "Periodic Event-based Control with Past Measurements Transmission", IEEE, 2017, 8 pages.

(56) References Cited

OTHER PUBLICATIONS

Notice of Grounds for Rejection received for Korean Patent Application Serial No. 10-2022-7004931 dated Mar. 22, 2022, 18 pages.
International Preliminary Report on Patentability received for International PCT Application Serial No. PCT/US2010/022906 dated Aug. 11, 2011, 7 pages.
International Search Report and Written Opinion received for International PCT Application Serial No. PCT/US10/022906 dated Mar. 21, 2010, 8 pages.
International Search Report and Written Opinion received for International PCT Application Serial No. PCT/US2022/014915 dated Mar. 21, 2022, 11 pages.
Maurice, C. Y. M., "Inductively Coupled Plasmas : Ion Dynamics and Interactions with Bone Tissue", Technische Universiteit Eindhoven, pp. 203, 2003.
Non-Final Office Action received for U.S. Appl. No. 12/698,007 dated Feb. 9, 2012, 18 pages.
Non-Final Office Action received for U.S. Appl. No. 17/113,088 dated Dec. 13, 2021, 49 pages.
Notice of Allowance received for U.S. Appl. No. 12/698,007 dated Aug. 7, 2012, 19 pages.
Notice of Allowance received for U.S. Appl. No. 16/028,131 dated Aug. 3, 2020, 31 pages.
Notice of Allowance received for U.S. Appl. No. 16/028,131 dated Aug. 27, 2020, 17 pages.
Notice of Ground for Rejection received for Korean Patent Application Serial No. 1020207001574 dated May 14, 2021, 18 pages (Including English Translation).
Office Action received for Taiwanese Patent Application Serial No. 107123277 dated Jul. 8, 2020, 19 pages (Including English Translation).
Remy, Jerome, "Supplemental Extended Search Report Regarding European Patent Application No. 18827671.1", dated Feb. 9, 2021, p. 10, Published in: EP.
Japanese Patent Office, "Office Action Issued in Japanese Patent Application No. 2020-500181", dated Feb. 2, 2021, Published in: JP.
TIPO, "Official Action From the Intellectual Property Office of Taiwan Regarding Application No. 107123277", dated Jul. 8, 2020, p. 19, Published in: TW.
Sathiraju, Srinivas, "Final Office Action Regarding U.S. Appl. No. 16/028,131", dated Mar. 10, 2020, p. 36, Published in: US
Sathiraju, Srinivas, "Office Action Regarding U.S. Appl. No. 16/028,131", dated Mar. 31, 2019, p. 29, Published in: US.
Sathiraju, Srinivas, "Office Action Regarding U.S. Appl. No. 16/028,131", dated Oct. 4, 2019, p. 27, Published in: US.
Sathirajui, Srinivas, "Office Action Regarding U.S. Appl. No. 16/028,131", dated Nov. 20, 2018, p. 24, Published in: US.
Thomas, Shane, "International Search Report and Written Opinion Regarding International Application No. PCT/US2018/040930", dated Nov. 1, 2018, p. 15, Published in: US.

\* cited by examiner

INTER-PERIOD CONTROL FOR PASSIVE POWER DISTRIBUTION OF MULTIPLE ELECTRODE INDUCTIVE PLASMA SOURCE

CLAIM OF PRIORITY UNDER 35 U.S.C. § 120

The present Application for Patent is a Continuation-in-Part of patent application Ser. No. 17/113,088 entitled "INTER-PERIOD CONTROL SYSTEM FOR PLASMA POWER DELIVERY SYSTEM AND METHOD OF OPERATING THE SAME," filed Dec. 6, 2020, pending, which is a Continuation of patent application Ser. No. 16/028,131 entitled "INTER-PERIOD CONTROL SYSTEM FOR PLASMA POWER DELIVERY SYSTEM AND METHOD OF OPERATING THE SAME," filed Jul. 5, 2018, and issued as U.S. Pat. No. 10,861,677 on Dec. 8, 2020, which claims priority under 35 U.S.C. § 119(e) from U.S. Patent Application No. 62/529,963, filed Jul. 7, 2017 entitled "INTER-PERIOD CONTROL SYSTEM FOR PLASMA POWER DELIVERY SYSTEM AND METHOD OF OPERATING THE SAME." These applications and patents are assigned to the assignee hereof and hereby expressly incorporated by reference.

TECHNICAL FIELD

Aspects of the present disclosure relate to improved methods and systems for controlling a power delivery system, and particularly for controlling a plasma power delivery system.

BACKGROUND

Plasma processing systems are used to deposit thin films on a substrate using processes such as chemical vapor deposition (CVD) and physical vapor deposition (PVD) as well to remove films from the substrate using etch processes. The plasma is often created by coupling radio frequency (RF) or direct current (DC) generators to a plasma chamber filled with gases injected into the plasma chamber at low pressure. In some instances, the RF generator is coupled to a variable impedance match network that may match the plasma impedance to a desired impedance, typically 50Ω, at the generator output. Typically, a generator delivers RF power to an antenna, or electrodes, in the plasma chamber, and power delivered at the antenna ignites and sustains a plasma. In some implementations, inductive coil antennas are wound around a reactive chamber and actively driven by RF power so as to prompt ignition of (and to maintain) a plasma in the chamber. Systems have been developed to utilize a single generator to drive two coil antennas. In these systems, a generator is typically coupled (e.g., through an RF match) to the first coil and a series capacitor couples the first coil to the second coil so that the two coils are both actively driven by the generator (e.g., actively driven through an RF impedance match). The generator alone or the generator in combination with other pieces of equipment, such as the impedance matching network, other generators coupled to the same plasma, cables, etc., constitute a plasma power delivery system.

Modulation of the power delivered to the plasma system is often desired. Most modulation schemes are repetitive, i.e., the same modulation waveform is repeated at a waveform repetition rate. The associated waveform repetition period is equal to one divided by the waveform repetition rate. The ability to follow a prescribed modulation waveform using a traditional control scheme requires high bandwidth from the controller and ultimately from the measurement system. Many plasma systems have power applied to the plasma at different frequencies. The nonlinear nature of the plasma load creates intermodulation products that can interfere with a generator's measurement system. Thus, it is sometimes advantageous to use a narrowband measurement system to limit such interference. In many applications, power delivered to the plasma load is not the only parameter that is being controlled. For example, in RF power delivery systems, the impedance presented to the generator by the plasma load can be controlled, either through controlling the frequency of the generator output or through controlling the variable impedance match network between the generator and the plasma load. In some cases, generator source impedance may also be controlled. Tracking and controlling power in light of these various issues presents ever greater control challenges.

It is with these observations in mind, among others, that aspects of the present disclosure were conceived.

SUMMARY

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

According to one embodiment, a generator produces output such as delivered power, voltage, current, forward power etc. that follows a prescribed pattern of output versus time where the pattern repeats with a repetition period by controlling sections of the pattern based on measurements taken one or more repetition periods in the past. In one example, a power delivery system involves a generator that produces a repeating output pattern and a control element controls the repeating pattern based on a measurement of a value of the repeating pattern taken a period prior to a current period. The control element may further control the repeating output pattern based on the measurement of the repeating pattern taken a period prior to the current period combined with a measurement of a value of the repeating pattern during a current period. The repeating output pattern may follow a prescribed pattern of output versus time wherein the prescribed pattern repeats with a repetition period, and wherein the measurement of the value of the repeating pattern taken a period prior to the current period occurs one or more repetition periods in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past. The generator may provide the delivered power, voltage, current, forward power, etc., to a plasma system in order to ignite and sustain a plasma, in various possible embodiments.

According to yet another embodiment, a generator produces output that follows a prescribed pattern of output versus time where the pattern repeats with a repetition period by controlling sections of the pattern based on measurements taken one or more repetition periods in the past; and combining this controller with an intra-period controller that calculates the control output based on measurements taken less than a repetition period in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past; and combining this controller with an intra-period controller that calculates the control of the variable impedance elements in the match based on measurements taken less than a repetition period in the past.

According to another embodiment, a generator produces output that follows a prescribed pattern of output versus time where the pattern repeats with a repetition period by controlling sections of the pattern based on measurements taken one or more repetition periods in the past while at the same time adjusting another parameter such as generator output frequency or variable impedance elements contained in the generator or in a variable impedance matching network coupled between the generator and the plasma based on measurements taken one or more repetition periods in the past where the correlation between the control inputs such as power control and generator frequency and control outputs such as delivered power and impedance presented to the generator is determined and used by the control system.

According to yet another embodiment, a generator produces output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform.

One embodiment of the disclosure may be characterized as a system for controlling the spatial distribution of plasma in a processing chamber. The system in this embodiment includes a primary inductor disposed to excite the plasma when power is actively applied to the primary inductor; at least one secondary inductor located in proximity to the primary inductor such that substantially all current that passes through the secondary inductor results from mutual inductance through the plasma with the primary inductor; and at least one terminating element coupled to the at least one secondary inductor, the at least one terminating element affecting the current through the at least one secondary inductor so as to affect the spatial distribution of the plasma.

Another embodiment may be characterized as a method for controlling a spatial distribution of plasma in a processing chamber that includes a primary inductor and N secondary inductors. The method includes exciting the plasma in the processing chamber with the primary inductor; inductively coupling the primary inductor to each of N secondary inductors through the plasma, wherein N is equal to or greater than one; and terminating each of the N secondary inductors such that substantially all current that passes through each of the N secondary inductors results from mutual inductance through the plasma with the primary inductor, the current through each of the N secondary inductors affecting the spatial distribution of the plasma.

Yet another embodiment of the disclosure may be characterized as an apparatus for controlling the spatial distribution of plasma in a processing chamber. The apparatus includes a primary terminal configured to couple to, and actively apply power to, a primary inductor of the plasma processing chamber; a secondary terminal configured to couple to a corresponding secondary inductor of the plasma processing chamber; and a terminating element coupled to the secondary terminal, the terminating element disposed to provide a path for current flowing through the secondary inductive component, wherein substantially all the current that passes through the secondary inductor and the terminating element results from mutual inductance through the plasma with the primary inductor.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

DETAILED DESCRIPTION

Inter-Period Control of Distributed Inductive Electrodes

Figure 1A:
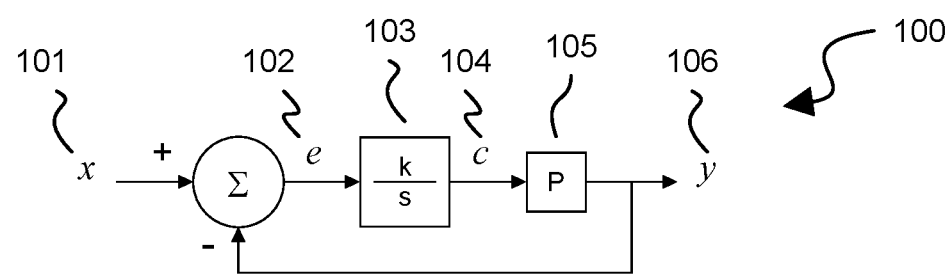
FIG. 1A illustrates a simple analog intra-period.

Embodiments of the present disclosure provide a plasma power delivery system that produces an output, such as delivered power, voltage, current, and forward power, that follows a prescribed pattern of output versus time where the pattern repeats with a repetition period by controlling sections of the pattern based on measurements taken one or more repetition periods in the past as opposed to within the current period. Compared to a conventional controller, such an inter-period controller can reproduce output more accurately utilizing a lower bandwidth measurement and control system. The benefits provided by the inter-period controller can be advantageous in various contexts including in the presence of plasma generated mixing and intermodulation products. In additional embodiments, the inter-period controller can be combined with a conventional intra-period controller. In additional embodiments, parameters, such as generator output frequency, may be adjusted together with the main output based on measurements taken one or more repetition periods in the past where the correlation between the control inputs, such as power control and generator frequency, and control outputs, such as delivered power and impedance presented to the generator are determined and used by the control system. In additional embodiments, a generator produces output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform.

While primarily described with reference to a controller for a generator, aspects of the present disclosure are applicable to switch mode power supplies, and controllers for the same, which may be used in eV source applications such as to provide a bias to a substrate as part of an overall power delivery system, as well as other substrate biasing schemes. The controller and control schemes discussed herein may also be used to control variable impedance elements (such as vacuum variable capacitors or switched variable reactance elements) of impedance matching networks. In such instances, aspects of the present disclosure may or may not also be used in the controlling of an RF supply to the impedance matching network as part of the overall power delivery system. The controller may reside in any part of the power delivery system (e.g., in the generator or in the matching network) and may or may not receive information from and control other parts of the power delivery system. For example, a controller residing in the generator may control both a generator and a match that are part of the power delivery system with information obtained only from the generator, only from the match or from both the generator and the match. The controller and control schemes discussed herein may also be used in other systems with or without delivering power in a plasma power delivery environment.

Figure 1B:
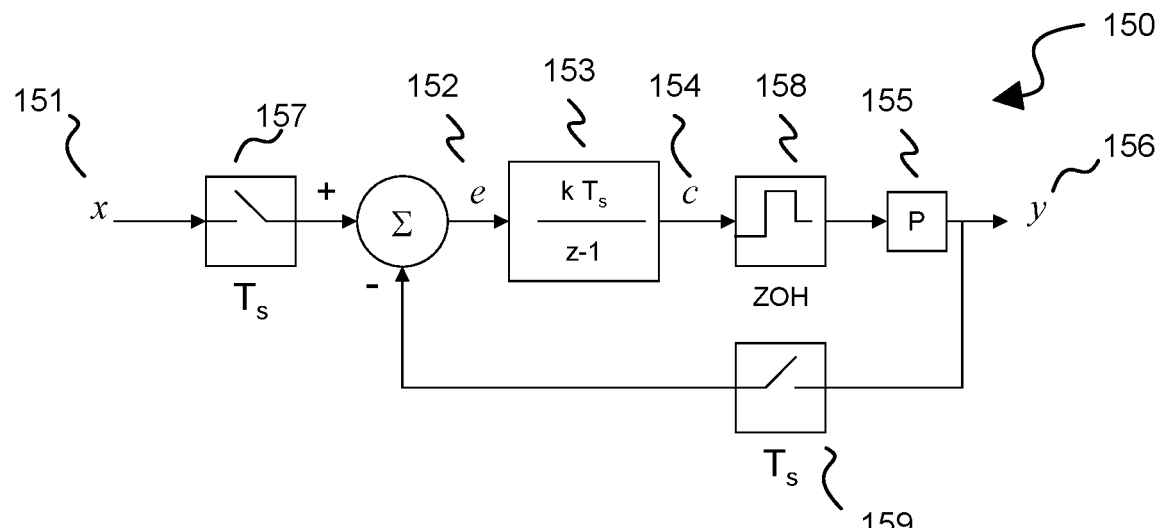
FIG. 1B illustrates a simple digital intra-period control systems that may be used to control a plasma power delivery system.

FIG. 1A (prior art) illustrates a simple analog intra-period, and FIG. 1B (prior art) illustrates a simple digital intra-period control systems that may be used to control a plasma power delivery system. In FIG. 1A the difference between an input 101 and output 106 produces an error signal 102 that a controller 103 uses to produce a control input 104 to a plant 105. In this illustration, the controller is a simple integrator with a gain of k. In an actual implementation, the control input 104, c, may be a drive level to a power amplifier, and the plant 105, P, a power amplifier. To illustrate the performance differences between this controller and the disclosed inter-period controller, the plant 105, P, is a unity gain block, i.e., y=c. With these assumptions, the loop gain has unity gain at k rad/s or $k/(2\pi)$ Hz, the time constant of the system step response is $1/k$ s and the integral of the impulse response of the system reaches 63.2% (1−1/e) in $1/k$ s. In FIG. 1B, an input 151 is sampled at a sampling rate of $1/T_s$ and digitized by a sampler 157. (In some applications the input is already a digital data stream and the sampler 157 is not present in the system.) The output 156 is sampled and digitized by a sampler 159 and the difference between the input and output produces an error signal 152 that a controller 153 uses to produce a control input 154, which is converted to an analog control signal by a digital to analog converter 158 which is fed to a plant 155. As for FIG. 1A, to illustrate the performance differences between this controller and the disclosed inter-period controller, the plant 105, P, is a unity gain block. The same statements regarding relationship between k and the unity gain frequency and response times hold as for the analog controller of FIG. 1A provided that k is much less than $2\pi/T_s$.

Figure 2A:
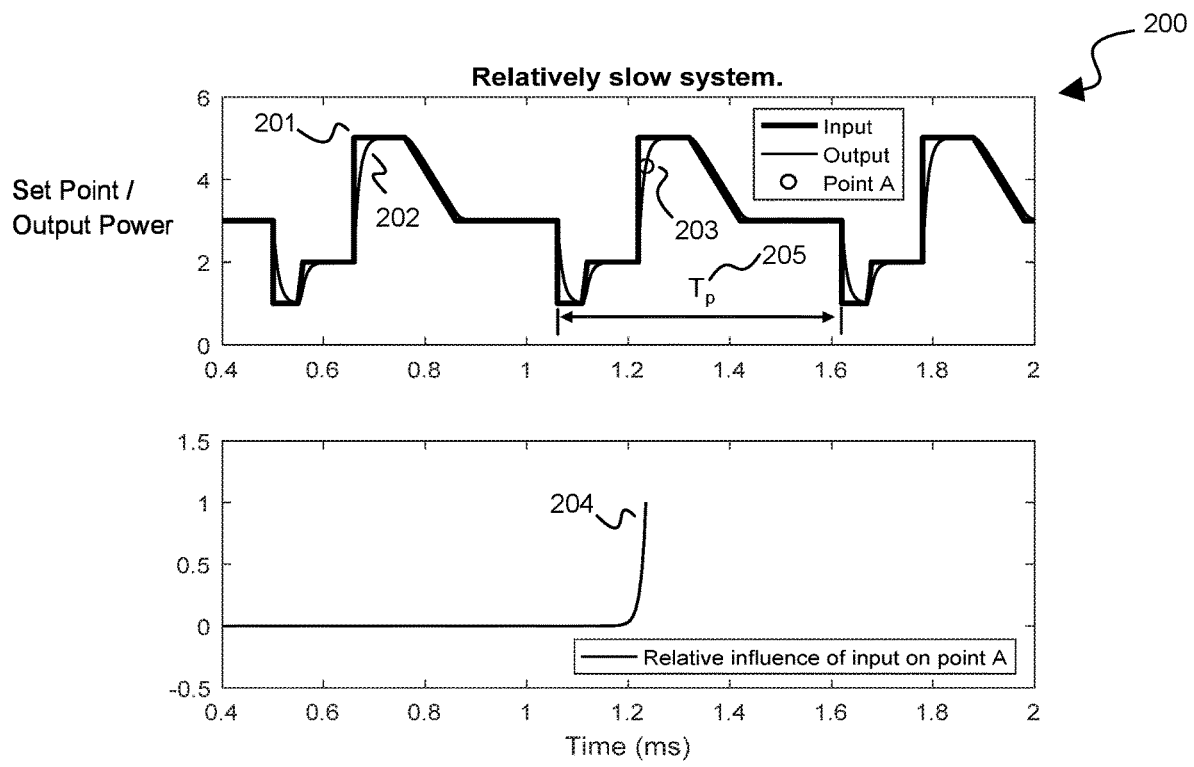
FIG. 2A illustrates the response of a relatively slow intra-period control system to a periodic input and FIG. 2B illustrates the response of a relatively fast intra-period control system to a periodic input.
Figure 2B:
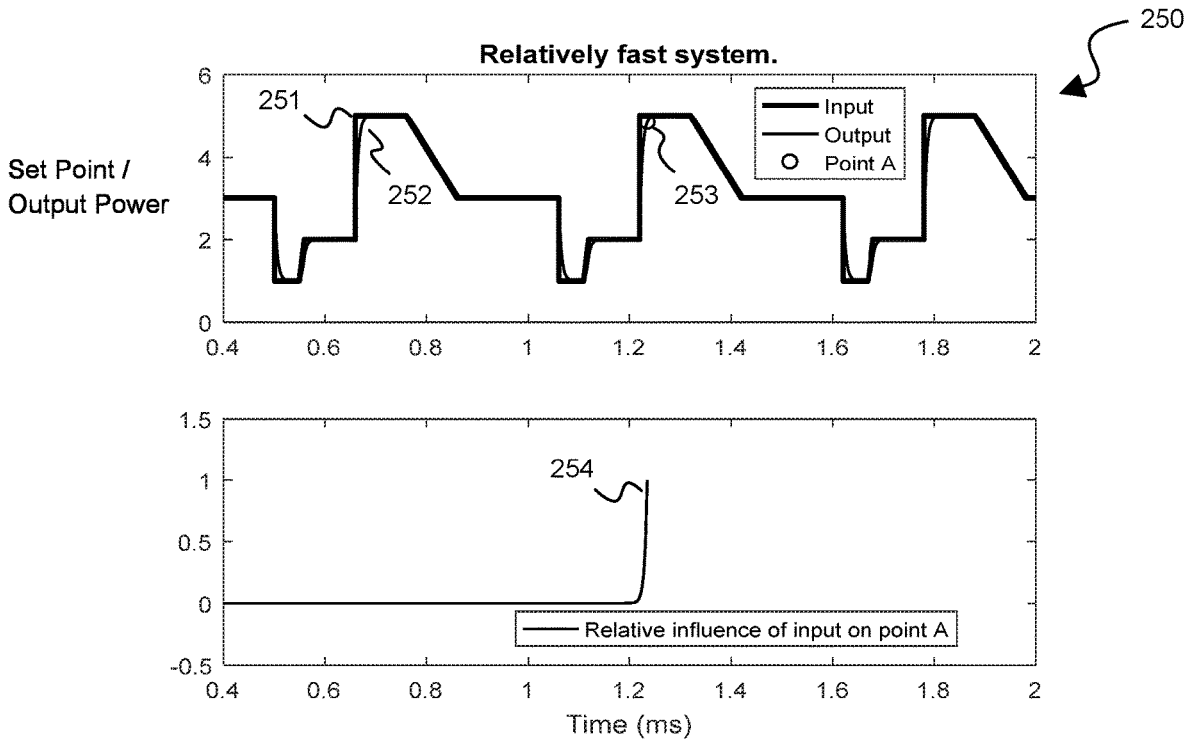

FIG. 2A (prior art) shows the response 200 of the simple intra-period controller such as shown in FIG. 1A or FIG. 1B to a periodic input with period $T_p$, 205. In this example a host of different set points (e.g., a set point power of 1, followed by 2, followed by 5, with a ramp to 3) defines one period of the input. The output, 202, follows the input, 201 with visible inaccuracy (where the output does not match the input set point). The time constant of the closed loop response for this illustration is 10 μs. The output at a given point, A, 203, can be obtained by multiplying the time shifted time reversed impulse response of the system with the input and integrating. The normalized time shifted time reversed impulse response of the unit, 204, shows that the output at point A, 203, is heavily influenced by the very recent past (within one time constant or 10 µs prior to point A), and almost not at all by events occurring earlier than 10 time constants prior to point A. To accommodate the changing set points within a pulse, the conventional controller must be very fast. As shown in FIG. 2B (prior art), speeding up the controller improves the ability of the output to follow the input accurately. The time constant of the closed loop response for this illustration is 5 µs. The response, 250, shows that the output, 252, follows the input, 251, more closely. The normalized time shifted time reversed impulse response 254 shows that the point A, 253, is now even more heavily influenced by the input in the very recent past.

In these conventional intra-period controllers, the error control is based on the measured value of the current output (within the period) against the set point. So, referring to FIG. 2A, for example, the measured value of the output at time 1.5 ms would be compared against the set point value at that same time to generate the error signal. Stated differently, the set point values are compared against the measured values during the current period to generate the error signal for the conventional intra-period controller. In contrast, an inter-period controller compares the measured value of the output one or more cycles in the past for a given set point and uses the past measured value at the set point to generate the current error signal and controller output. Referring again to FIG. 2A, for example, at time 1.5 ms with a set point of 3, the measured value at time 0.94 ms (which is one waveform repetition period of 0.56 ms earlier or that part of the preceding pulse that correlates with time 1.5 ms) with the same set point of 3 would be used by the controller to generate the error and output, as opposed to the measured value within the pulse at time 1.5 ms. Notably, the inter-period controller need not be nearly as fast because it relies on a measured value one cycle in the past as opposed to an immediately proximate value within the pulse.

In some examples, the pulse (e.g., the pulse over period $T_p$) is divided into multiple time periods, and the corresponding (same) output value in the same time period of the previous pulse is used for the error signal. Referring again to the example immediately above referring to using the measured value at time 0.94 ms of the first pulse for the error correction at time 1.5 ms of the following second pulse, the time period would encompass the specific value of 0.56 ms within some range. In one example, the time periods by which pulses are divided are such that any given time period does not encompass different set points, with the exception of sloped set point transitions.

In various implementations, the inter-period pulse information is stored in some form of memory such that it can be accessed and used by the controller for the error feedback of the succeeding pulse. Complicated pulses, such as with sloped set point transitions, and otherwise different set points may benefit from relatively smaller time period subdivisions of the pulse, and therefore may require relatively larger and faster memory. In specific examples, pulses with between a 100 ms and 10 µs period $T_p$ may be subdivided into 1024 time slices, and output values for each slice stored for comparison to the measured valued in the same time slice of the subsequent pulse.

In some applications no error signal is generated. In impedance matching applications using an inter-period control scheme, information about an impedance presented to a generator one or multiple periods, $T_p$, 205, in the past can be used to adjust variable impedance elements within the matching network at the present time. The information can be used to calculate adjustments to the variable impedance matching elements without first generating an error signal. In impedance matching applications the setpoint (e.g., 101, 151, 303, 351, 501) is generally constant, but there is a periodic disturbance of the load impedance that must be matched to a desired input impedance. Such a periodic disturbance can for example arise from delivering power to a plasma load that follows a prescribed pattern of output versus time where the pattern repeats with a repetition period. In such a case a synchronization signal from for example the power source providing the prescribed pattern of power can be provided to the matching network to assist the matching network in synchronizing with the repetitive waveform of the disturbance.

Figure 3A:
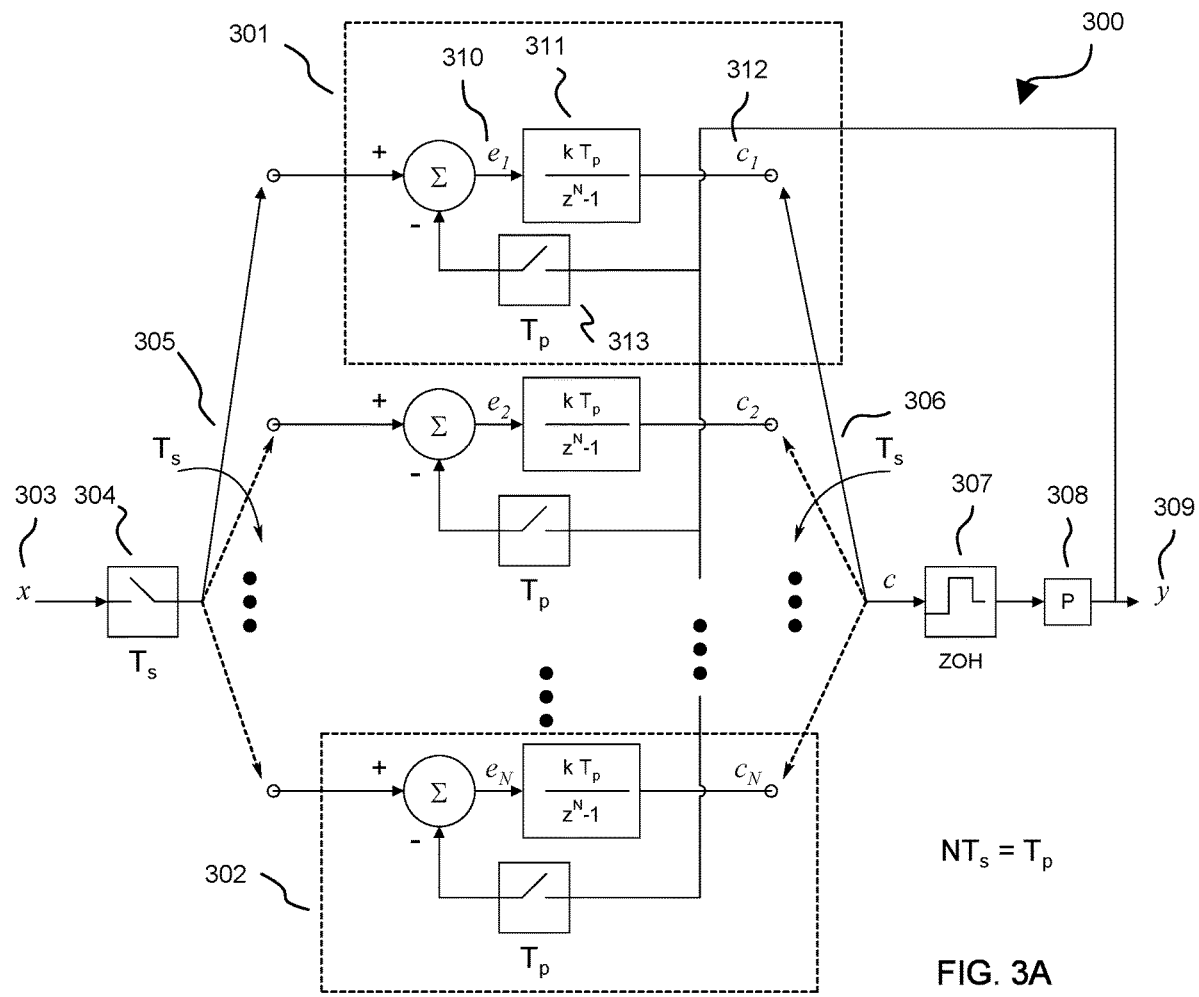
FIG. 3A and FIG. 3B illustrate block diagrams of example inter-period controllers that may be implemented in a plasma power delivery system according to embodiments of the present disclosure.
Figure 3B:
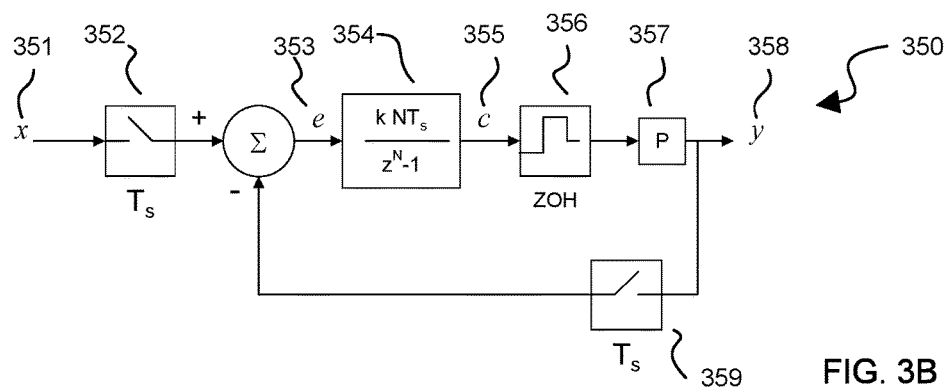

FIG. 3A illustrates a block diagram of one example of an inter-period controller 300 that may be implemented in a plasma power delivery system according to one embodiment of the present disclosure. FIG. 3B illustrates a block diagram of an alternate example implementation of an inter-period controller 350 that may be implemented in a plasma power delivery system according to another embodiment of the present disclosure. Some implementations of the inter-period controllers described herein may be considered multi-input-multi-output (MIMO) controllers. The controllers or more generally control elements may be implemented in hardware and software, with various possible combinations of the same. The control element may be integrated with the generator or other device, or may be a separate component. In some applications the inter-period controller may reside in a different piece of equipment from what is being controlled. As an example, a controller connected to an impedance matching network may reside in the generator but control variable impedance elements in the impedance matching network. In such an application forward and reflected signals from a coupler may be obtained from a coupler residing in the generator, filtered in analog, digitized in an analog to digital converter, and processed to extract the impedance presented to the generator by the match by a microprocessor running a software program or by digital logic circuits implemented in, for example, an FPGA. The measurements can be stored in memory by a microprocessor or reconfigurable digital circuits residing in an FPGA. The memory containing samples of impedance measurements at different times can be processed using software running in a microprocessor or by an FPGA. The software or FPGA can use samples one or multiple waveform repetition periods in the past to implement an inter-period control scheme. To implement such a scheme information about past values of variable impedance elements in the match can also be used. The controller can then send control signals to the match to change variable impedance elements in the match. FIG. 3A implements the inter-period controller (providing an inter-leaved scheme) as a number, N, of controllers each running at the repetition period, $T_p$, of the input. The block 301 shows the first such controller and the block 302 shows the N-th such controller. The input, 303, is sampled and digitized by an analog to digital converter, 304, at a sampling rate of $1/T_s$. (The input may already exist as a data stream in which case the converter 304 is not used.) The sampled input is switched or routed to the controllers in turn by a switch, 305 so that each controller receives an updated input at a rate of $1/T_p$. The outputs of the controllers are routed to a common control input, c, by a switch 306. The control input is converted to analog by a digital to analog converter 307 and applied to the control input of a plant, P, 308. The output, y, 309, is sampled by each controller at a rate of $1/T_p$ by a sampler (313 for controller 301).

Each controller creates an error function (310 for controller 301) by subtracting the input from the sampled output. (Since the sampled output is delayed by a waveform period, $T_p$, this implements an inter-period controller.) The error function is integrated (by 311 for controller 301) producing an output (312 for controller 301). The number of controllers, N, and the sampling period $T_s$ is adjusted so that $NT_s=T_p$. To cater for situations where the repetition period of the input, $T_p$, may vary a few sampling periods, extra controllers may be utilized. For example, there may be N+3 controllers to deal with a $T_p$ that can vary three sampling periods. When an extra control section is not updated due to a shorter than maximum $T_p$, the state of the last updated controller can be copied to the extra control section.

FIG. 3B shows an alternate implementation of an inter-period controller 350 in accordance with an embodiment of the present disclosure. The input 351 is sampled and digitized by an analog to digital converter, 352, at a sampling rate of $1/T_s$. (The input may already exist as a data stream in which case the converter 352 is not used.) The output 358 is sampled and digitized by an analog to digital converter 359. (The output may be a digital data stream derived from a measurement of the output in which case the analog to digital converter may not be implemented as shown.) An error function 353 is obtained by subtracting the input from the output. The controller 354 generates the control input to the plant, c, 355, from the values of the control input to the plant, c, 355, and the error function, e, 353, one period of the input, $T_p$, ago. This is significantly different from a conventional intra-period controller as will be shown infra. The control input to the plant is converted to an analog signal by a digital to analog converter, 356, and applied to a plant, 357. As for the controller 300, provision can be made to deal with situations where the repetition period of the input, $T_p$, may vary a few sampling periods. In this case, N is allowed to vary based on the number of sampling periods $T_s$ that fit in the previous period of the input $T_p$.

Figure 4A:
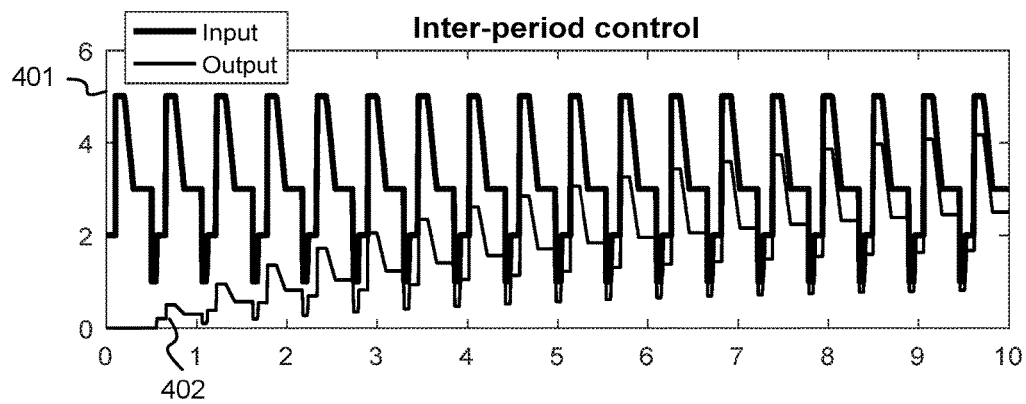
FIG. 4A-FIG. 4D illustrate the response of an example inter-period controller to a periodic input.
Figure 4B:
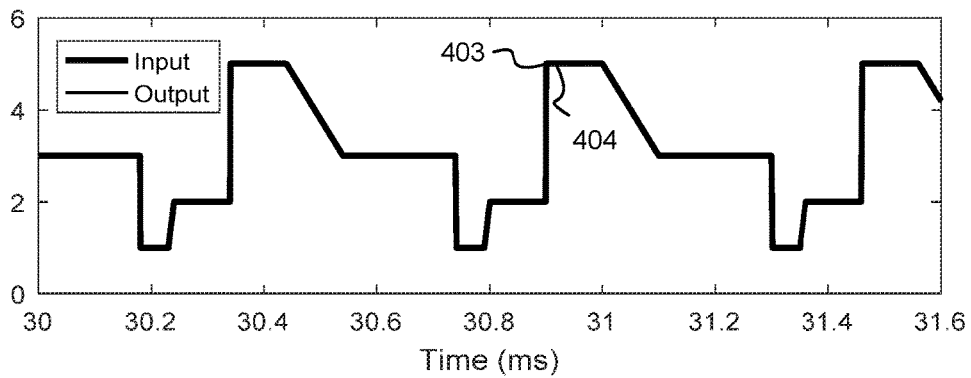
Figure 4C:
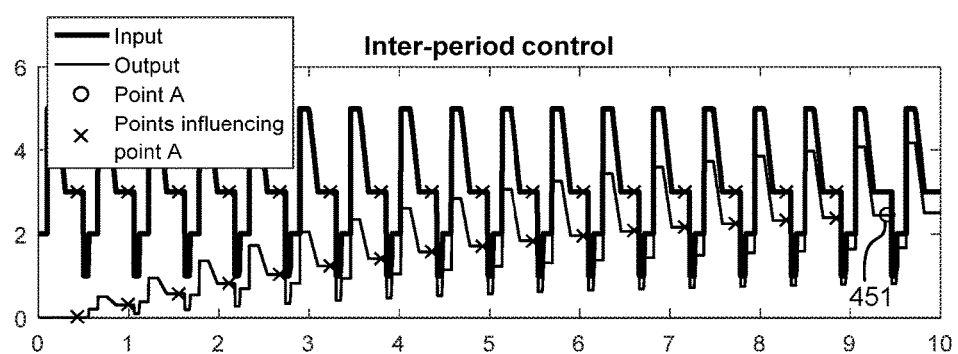
Figure 4D:
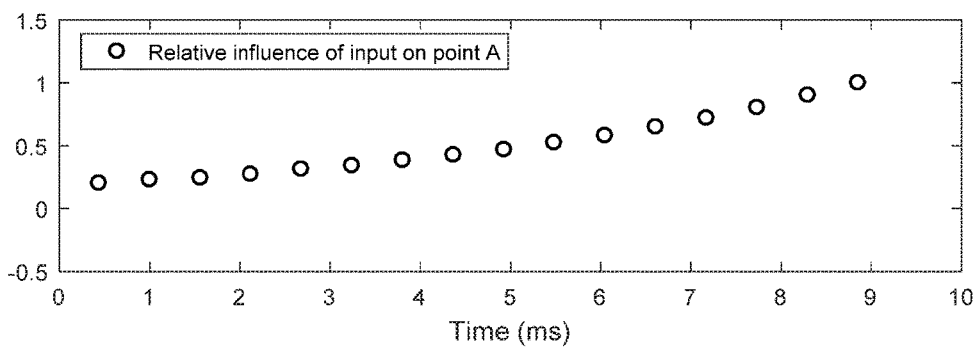

FIGS. 4A-4D show the response of an inter-period controller that may be implemented in a plasma power delivery system according to one embodiment of the present disclosure to a periodic control input. In FIGS. 4A and 4B the response 400 of the output 402 to a periodic input 401 is shown. As shown in the response 400, the output slowly converges to the input (FIG. 4A), but after about 30 cycles of the input (FIG. 4B) the output 404 follows the input 403 with almost imperceptible error. FIG. 4C shows that a point A, 451, on the response 450 and the points that influence point A. Note that for the inter-period controller point A, 451, is still significantly influenced by the input 5 ms in the past. Thus, even though each section of the output approaches the input with a time constant on the order of 5 ms, after a few periods of the input, the output can follow the input with almost imperceptible error. For the conventional intra-period controller, even with a 5 μs time constant, the output does not follow the input with this precision.

Figure 5:
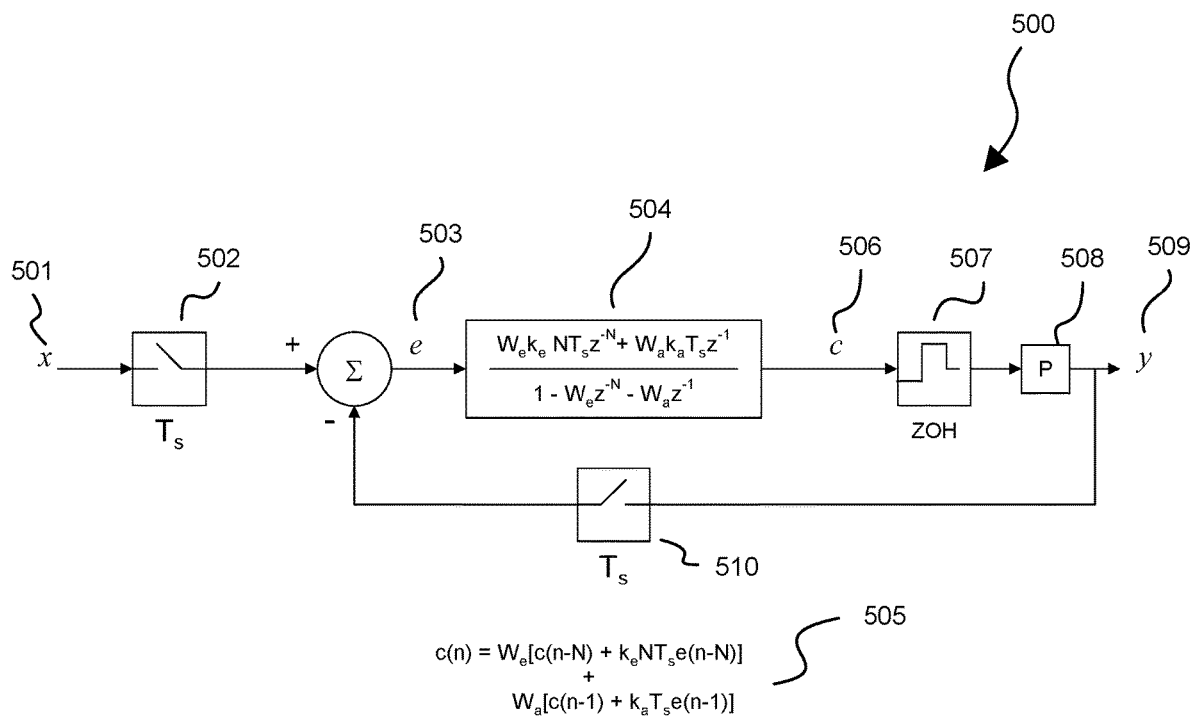
FIG. 5 illustrates a block diagram of an example combined inter-period and intra-period controller that may be implemented in a plasma power delivery system according to one embodiment of the present disclosure.

FIG. 5 illustrates a block diagram of an example combined inter-period and intra-period controller 500 that may be implemented in a plasma power delivery system according to one embodiment of the present disclosure. The input, 501, is sampled and digitized by an analog to digital converter, 502, at a sampling rate of $1/T_s$. (The input may already exist as a data stream in which case the converter 502 is not used.) The output 509 is sampled and digitized by an analog to digital converter 510. (The output may be a digital data stream derived from a measurement of the output in which case the analog to digital converter may not be implemented as shown.) An error function 503 is obtained by subtracting the input from the output. The controller 504 generates the control input to the plant, c, 506, from the values of the control input to the plant, c, 506, and the error function, e, 503, one period of the input, $T_p$, ago and one sampling period, $T_s$, ago. N and $T_s$ are chosen to satisfy $T_p=NT_s$. The control input, c, 506, is a weighted average of a value based on values one sampling period, $T_s$, ago and one period of the input, $T_p$, ago. This weighting is perhaps more clearly illustrated in the sequence (sampled time) domain shown in equation 505. In 504 and 505, $W_e$ is a real number between 0 and 1 and $W_a=1-W_e$. If $W_e=1$, the controller is a pure inter-period controller and if $W_e=0$ the controller is a conventional intra-period controller. The control input to the plant, c, 506, is converted to an analog signal by a digital to analog converter, 507, and applied to a plant, 508. Provision can be made to deal with situations where the repetition period of the input, $T_p$, may vary a few sampling periods. In this case, N is allowed to vary based on the number of sampling periods, $T_s$, that fit in the previous period of the input, $T_p$. In this case, if a section towards the end of the repetition was not recently updated, rather than copying the state from a prior sample, the weighting can be changed to run a pure intra-period controller ($W_e=0$) until the start of the next period of the input. This example combined inter-period and intra-period controller 500 has the additional advantage that it can easily transition from operating with a periodic input to operating with a non-repetitive input, 501.

Figure 6A:
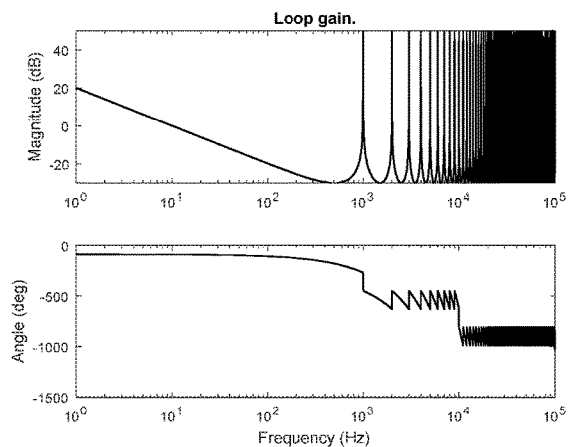
FIG. 6A illustrates the loop gain as a function of frequency of an example pure inter-period controller.
Figure 6B:
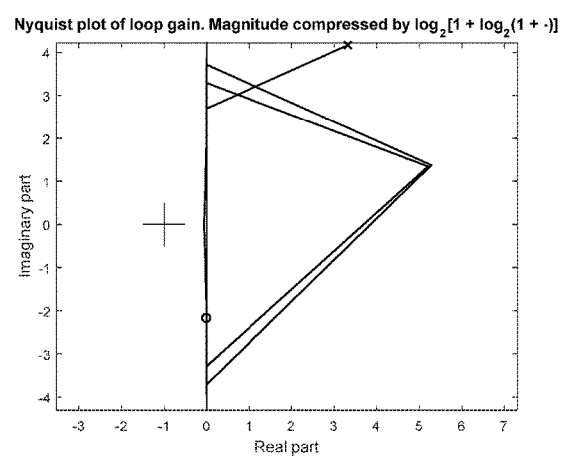
FIG. 6B illustrates the Nyquist plot of the loop gain for the inter-period controller generating the loop gain of FIG. 6A.
Figure 6C:
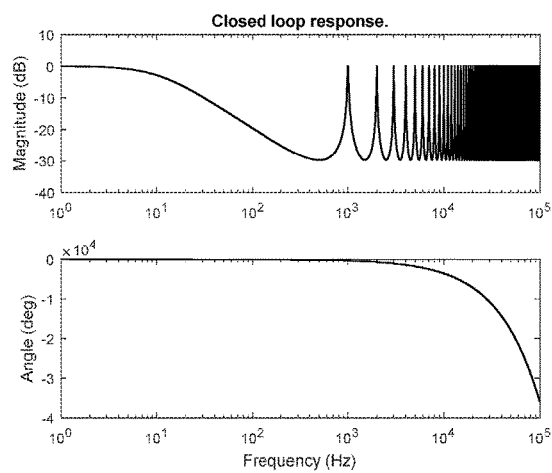
FIG. 6C illustrates the closed loop response as a function of frequency for the inter-period controller generating the loop gain of FIG. 6A.
Figure 6D:
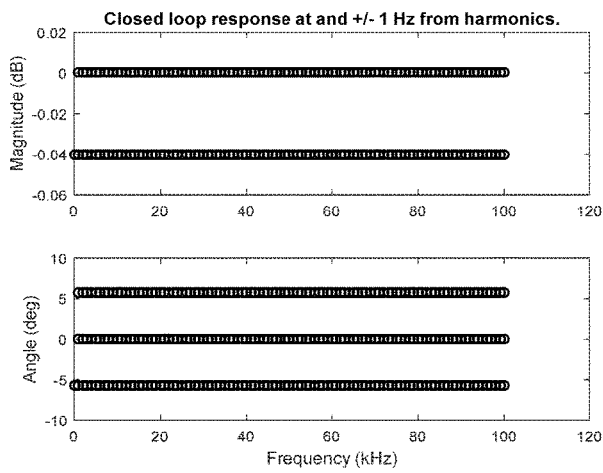
FIG. 6D illustrates the closed loop response as a function of frequency at and close to the harmonics of the input waveform for the pure inter-period controller.

FIG. 6A, FIG. 6B, FIG. 6C and FIG. 6D illustrate properties of an example inter-period controller such as 300, 350 or 500 (with $W_e=1$) that may be implemented in a plasma power delivery system according to one embodiment of the present disclosure. For ease of illustration, in FIG. 6 the plant, P, 308, 357 or 506 is a simple unity gain block, the sample period $T_s=1$ μs, the repetition period $T_p=1$ ms, and hence $N=Tp/Ts=1000$, and k ($k_e$ in 500)=62.83 The Bode plot of the loop gain of an inter-period controller is shown in FIG. 6A. The loop gain is very different from a traditional intra-period controller. There is a first gain cross over frequency at 10 Hz as may be expected for a gain, k ($k_e$ in 500)=62.83=2π10, but the magnitude of the gain returns to infinity at the harmonics of the input (multiples of $1/T_p$); a unique property of the inter-period controller that allows it to follow a periodic input with unprecedented precision. FIG. 6B shows a Nyquist plot of the loop gain. To facilitate interpretation of the Nyquist plot, the magnitude of the loop gain is scaled by $\log_2(1+\log_2(1+●))$. This mapping maps 0 to 0, 1 to 1 and is monotonically increasing so we can still verify that the point −1+j0 in the complex plane is not encircled. Despite the multiple gain crossings in the Bode plot, the Nyquist plot shows that the system is stable. FIG. 6C shows the magnitude and phase of the closed loop response of the system. FIG. 6D shows the magnitude and phase of the closed loop response of the system only at the harmonics of the input and +/−1 Hz from the harmonics of the input. FIG. 6D shows that the gain at the harmonics is unity gain confirming that a periodic input with period $T_p$ will be followed with precision. In FIG. 6D the points that have exactly 0 dB gain and 0 phase (unity gain) are exactly at the harmonics of the input, points having a gain of −0.04 dB and phase of +/−5 degrees are 1 Hz above and below the harmonic of the input.

Figure 7A:
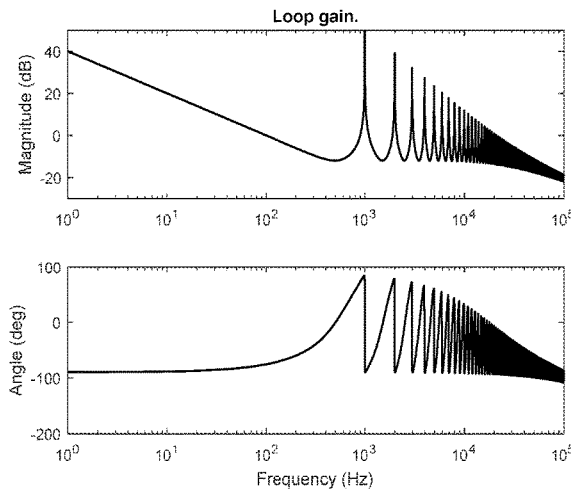
FIG. 7A illustrates the loop gain as a function of frequency of an example combined inter-period and intra-period controller with a 0.1 weighting for the inter-period part and a 0.9 weighting for the intra-period part.
Figure 7B:
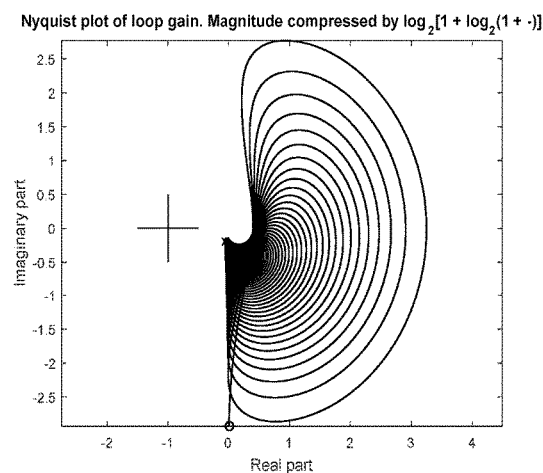
FIG. 7B illustrates the Nyquist plot of the loop gain related to FIG. 7A.
Figure 7C:
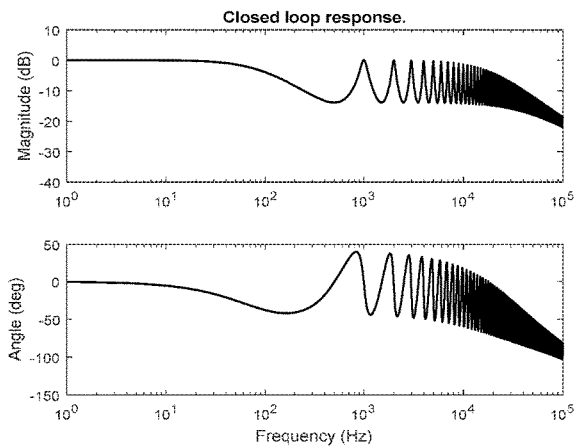
FIG. 7C illustrates the closed loop response as a function of frequency of the example combined controller related to FIG. 7A.
Figure 7D:
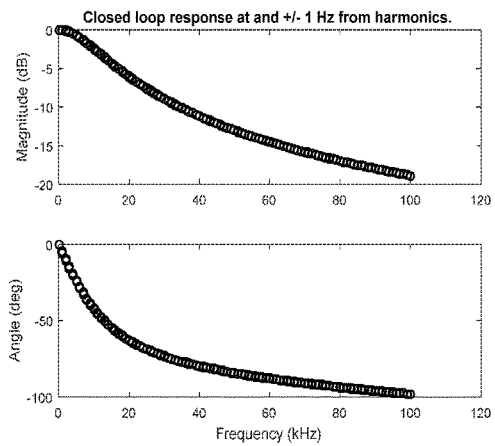
FIG. 7D illustrates the closed loop response as a function of frequency at and close to the harmonics of the input waveform for the combined inter-period and intra-period controller related to FIG. 7A.

FIG. 7A, FIG. 7B, FIG. 7C and FIG. 7D illustrate properties of an example combined inter-period controller and intra-period controller 500 with $W_e=0.1$ that may be implemented in a plasma power delivery system according to one embodiment of the present disclosure. For ease of illustration, in FIG. 7 the plant, P, 506 is a simple unity gain block, the sample period $T_s=1$ μs, the repetition period $T_p=1$ ms, and hence N=Tp/Ts=1000, $k_e=62.83$, and $k_a=62830$. The Bode plot of the loop gain of the combined inter-period and intra-period controller is shown in FIG. 7A. The loop gain is very different from a traditional intra-period controller. There is a first gain cross over frequency at 100 Hz, which is between the cross over frequency for $W_e=1$ of 10 Hz, and the cross over for $W_e=0$ of 10 kHz. The magnitude of the gain returns to high but finite values at the harmonics of the input (multiples of $1/T_p$); a unique property of the combined inter-period and intra-period controller. FIG. 7B shows a Nyquist plot of the loop gain. To facilitate interpretation of the Nyquist plot, the magnitude of the loop gain is scaled by $\log_2(1+\log_2(1+●))$. This mapping maps 0 to 0, 1 to 1 and is monotonic increasing so we can still verify that the point −1+j0 in the complex plane is not encircled. Despite the multiple gain crossings in the Bode plot, the Nyquist plot shows that the system is stable. FIG. 7C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision.

Figure 8A:
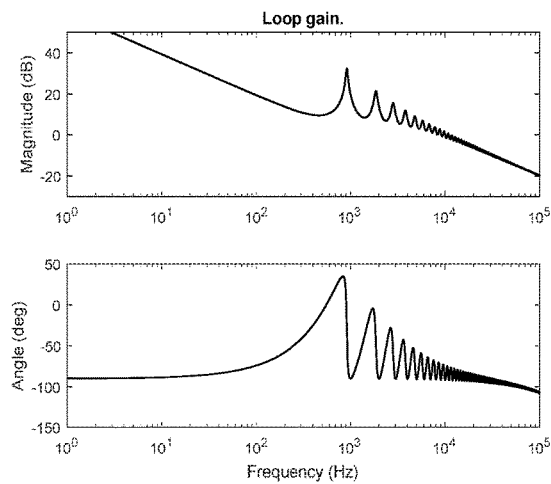
FIG. 8A illustrates the loop gain as a function of frequency of an example combined inter-period and intra-period controller with a 0.01 weighting for the inter-period part and a 0.99 weighting for the intra-period part.
Figure 8B:
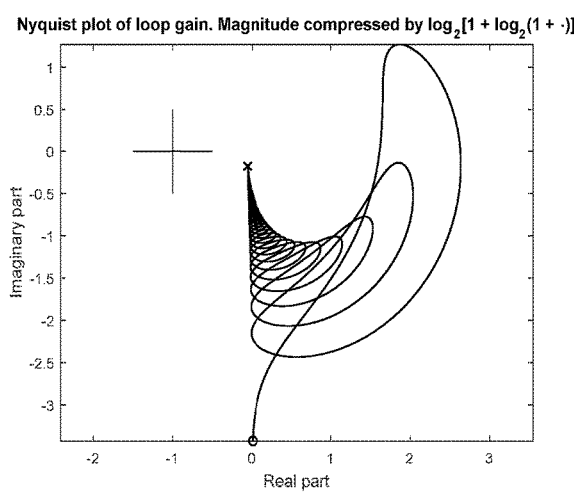
FIG. 8B illustrates the Nyquist plot of the loop gain for the combined controller related to FIG. 8A.
Figure 8C:
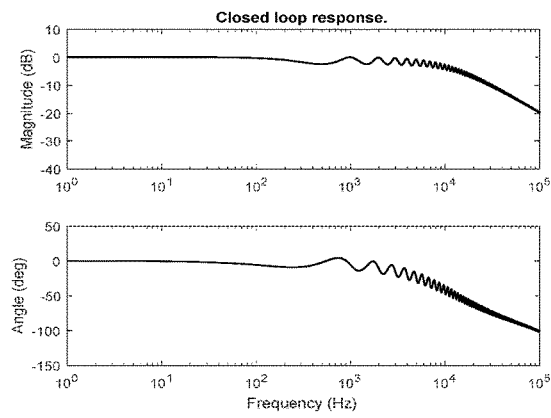
FIG. 8C illustrates the closed loop response as a function of frequency for the combined controller related to FIG. 8A.
Figure 8D:
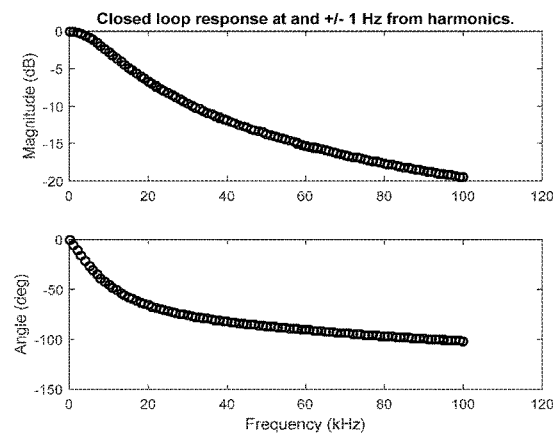
FIG. 8D illustrates the closed loop response as a function of frequency at and close to the harmonics of the input waveform for the same combined inter-period and intra-period controller related to FIG. 8A.

FIG. 8A, FIG. 8B, FIG. 8C and FIG. 8D illustrate properties of an example combined inter-period controller and intra-period controller 500 with $W_e=0.01$ that may be implemented in a plasma power delivery system according to one embodiment of the present disclosure. In FIG. 8 the plant, P, 506 is a simple unity gain block, the sample period $T_s=1$ μs, the repetition period $T_p=1$ ms, and hence N=Tp/Ts=1000, $k_e=62.83$, and $k_a=62830$. The Bode plot of the loop gain of the combined inter-period and intra-period controller is shown in FIG. 8A. The loop gain approaches that of a traditional intra-period controller. There is a first gain cross over frequency at 9.1 kHz, which is between the cross over frequency for $W_e=1$ of 10 Hz, and the cross over for $W_e=0$ of 10 kHz. The magnitude of the gain returns to values higher than unity two more times as the frequency increases. FIG. 8B shows a Nyquist plot of the loop gain. To facilitate interpretation of the Nyquist plot, the magnitude of the loop gain is scaled by $\log_2(1+\log_2(1+●))$. This mapping maps 0 to 0, 1 to 1 and is monotonic increasing so we can still verify that the point −1+j0 in the complex plane is not encircled. Despite the multiple gain crossings in the Bode plot, the Nyquist plot shows that the system is stable. FIG. 8C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision. This controller approaches the performance of an intra-period controller with a gain cross over frequency of 10 kHz.

Figure 9:
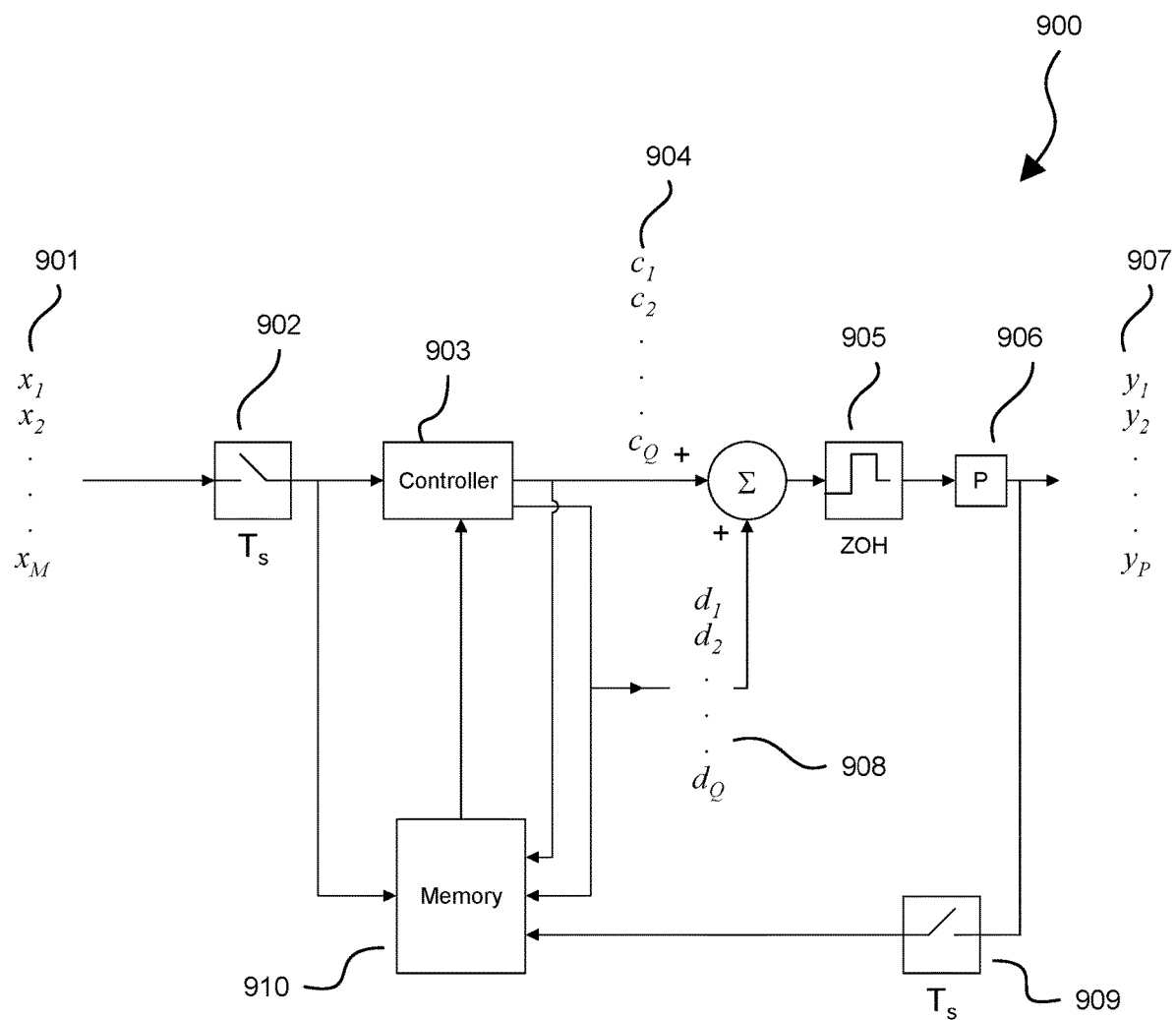
FIG. 9 illustrates a block diagram of a multi-input multi-output version of a combined inter-period and intra-period controller according to one embodiment of the present disclosure.

FIG. 9 illustrates a block diagram of a multi-input multi-output version of an example combined inter-period and intra-period controller 900 that may be implemented in a plasma power delivery system according to one embodiment of the present disclosure. The input, 901, is sampled and digitized by analog to digital converters, 902, at a sampling rate of $1/T_s$. (The input may already exist as a data stream in which case the converters 902 are not used.) The input is multi-dimensional and may, for example, contain inputs for output power and generator source impedance. The output 907 is sampled and digitized by analog to digital converters 909. (The output may be a digital data stream derived from a measurement of the output in which case the analog to digital converters may not be implemented as shown). The output is multi-dimensional and may, for example, include measurements of output power and impedance presented to the generator. The dimensionality of the input 901 and output 907 do not have to agree. This is so because an element of the output may contain a measure of something that is being minimized or maximized and thus does not require an input (e.g., the mismatch of the load impedance presented to the generator to a desired load impedance). Also, an element of the input may not require a corresponding measurement if the value can simply be set and does not require a corresponding measurement (e.g., setting the generator source impedance). Measurements of the input 901, control input 904, perturbation 908, and output 907 are stored in a memory 910. The controller 903 generates the control input to the plant, c, 904, from the values stored in memory, one period of the input, $T_p$, ago and one sampling period, $T_s$, ago. N and $T_s$ are chosen to satisfy $T_p=NT_s$.

In addition to calculating values of the control input to the plant, 904, the controller can also generate a perturbation 908 that is added to the calculated control. The control input 904 to the plant added to the perturbation 908 is converted to an analog signal by digital to analog converters, 905, and applied to a plant, 906. Perturbations 908 can be used to extract correlations between the control input 904 and output 907. For example perturbing the control element in 904 that primarily controls output power (e.g., drive level to a power amplifier) and observing the change in both output power and impedance presented to the generator by the plasma load and then perturbing the control element that primarily controls the impedance presented to the generator (e.g. generator frequency) and observing both output power and impedance presented to the generator by the plasma load allows the controller to extract the correlation between control inputs 904 and outputs 907. If the input is periodically modulated, the correlation between control inputs 904 and outputs 907 are also modulated (assuming the load is nonlinear as is the case for most plasma loads). An inter-period controller can correlate control inputs 904 and outputs 907 for each specific time period in the repetitive input cycle. For example, for $T_p=1$ ms and $T_s=1$ μs, the controller can maintain 1000 matrices correlating 904 with 907 for each of the 1000 time periods in the input. In addition to extracting correlation between elements of the control input 904 and elements of the output 907 for each specific time period, correlation can be extracted between different time periods. For example, the controller can determine how a change in an element of the control input in one time period affects the output in successive time periods.

A simple example illustrates the advantage of knowing these correlations. Consider the decision on how to update a two-dimensional control vector (e.g., drive and frequency) and a two-dimensional output (e.g., output power and load resistance) for the $7^{th}$ time period in the periodic input. Let the desired change in the outputs of the $7^{th}$ time period be:

$$\begin{bmatrix} \Delta y_1(7) \\ \Delta y_2(7) \end{bmatrix}$$

Assuming that through perturbation the correlation between the outputs in the $7^{th}$ time period and the control inputs in the $6^{th}$ and $7^{th}$ time periods are estimated:

$$\begin{bmatrix} \frac{\partial y_1(7)}{\partial c_1(7)} & \frac{\partial y_1(7)}{\partial c_2(7)} & \frac{\partial y_1(7)}{\partial c_1(6)} & \frac{\partial y_1(7)}{\partial c_2(6)} \\ \frac{\partial y_1(7)}{\partial c_1(7)} & \frac{\partial y_1(7)}{\partial c_2(7)} & \frac{\partial y_1(7)}{\partial c_1(6)} & \frac{\partial y_1(7)}{\partial c_2(6)} \end{bmatrix}$$

It follows that (approximately):

$$\begin{bmatrix} \Delta y_1(7) \\ \Delta y_2(7) \end{bmatrix} = \begin{bmatrix} \frac{\partial y_1(7)}{\partial c_1(7)} & \frac{\partial y_1(7)}{\partial c_2(7)} \\ \frac{\partial y_1(7)}{\partial c_1(7)} & \frac{\partial y_1(7)}{\partial c_2(7)} \end{bmatrix} \begin{bmatrix} \Delta c_1(7) \\ \Delta c_2(7) \end{bmatrix} + \begin{bmatrix} \frac{\partial y_1(7)}{\partial c_1(6)} & \frac{\partial y_1(7)}{\partial c_2(6)} \\ \frac{\partial y_1(7)}{\partial c_1(6)} & \frac{\partial y_1(7)}{\partial c_2(6)} \end{bmatrix} \begin{bmatrix} \Delta c_1(6) \\ \Delta c_2(6) \end{bmatrix}$$

When the inputs for the $7^{th}$ time period need to be adjusted, the changes to the inputs of the $6^{th}$ time period have already been made, thus:

$$\begin{bmatrix} \Delta c_1(6) \\ \Delta c_2(6) \end{bmatrix}$$

is known and it follows that:

$$\begin{bmatrix} \Delta y_1(7) \\ \Delta y_2(7) \end{bmatrix} = \begin{bmatrix} \frac{\partial y_1(7)}{\partial c_1(7)} & \frac{\partial y_1(7)}{\partial c_2(7)} \\ \frac{\partial y_1(7)}{\partial c_1(7)} & \frac{\partial y_1(7)}{\partial c_2(7)} \end{bmatrix}^{-1} \left( \begin{bmatrix} \Delta y_1(7) \\ \Delta y_2(7) \end{bmatrix} - \begin{bmatrix} \frac{\partial y_1(7)}{\partial c_1(6)} & \frac{\partial y_1(7)}{\partial c_2(6)} \\ \frac{\partial y_1(7)}{\partial c_1(6)} & \frac{\partial y_1(7)}{\partial c_2(6)} \end{bmatrix} \begin{bmatrix} \Delta c_1(6) \\ \Delta c_2(6) \end{bmatrix} \right)$$

The simple example uses two inputs to the plant (drive and frequency) and two outputs (output power and load resistance). Output resistance is only one component of load impedance. In a practical application it is load impedance that is important, not just the resistive part of load impedance, In such a case a third input would have to be utilized (e.g. a variable reactance element in a matching network), or optimization techniques can be employed to find the best solution using only two inputs controlling three outputs rather than the simple computations in the example.

Multi-input multi-output control in conjunction with inter-period control allows control of multiple parameters in one control loop. This avoids the problem of interfering control loops which normally necessitates using widely differing speeds for different control loops in the same plasma power delivery system.

Inter-period control allows for a single controller to more readily control multiple generators delivering power to the same plasma system. The data rate for inter-period and intra-period controllers are the same since the control input to the plant is updated at the sampling rate $1/T_s$. However, the intra-period controller needs information from one sampling period $T_s$ earlier to update a current control input to a plant whereas the inter-period controller needs information from one input period $T_p$ earlier to update a control input to a plant. Since in most cases $T_p$ is multiple times longer than $T_s$, it is much easier to get information to and from a controller before that information is needed for the inter-period controller. Inter-period controllers can thus much more readily take interactions between different generators into account to improve overall control of all generators delivering power to the same plasma system.

In the given examples of inter-period and mixed inter-period and intra-period controllers, the controllers used samples of signals one sampling period, $T_s$, or one repetition period, $T_p$, in the past. Of course, the controller can also use samples of signals multiple sampling periods or repetition periods in the past.

Passive Power Distribution for Multiple Electrode Inductive Plasma Source

Figure 10:
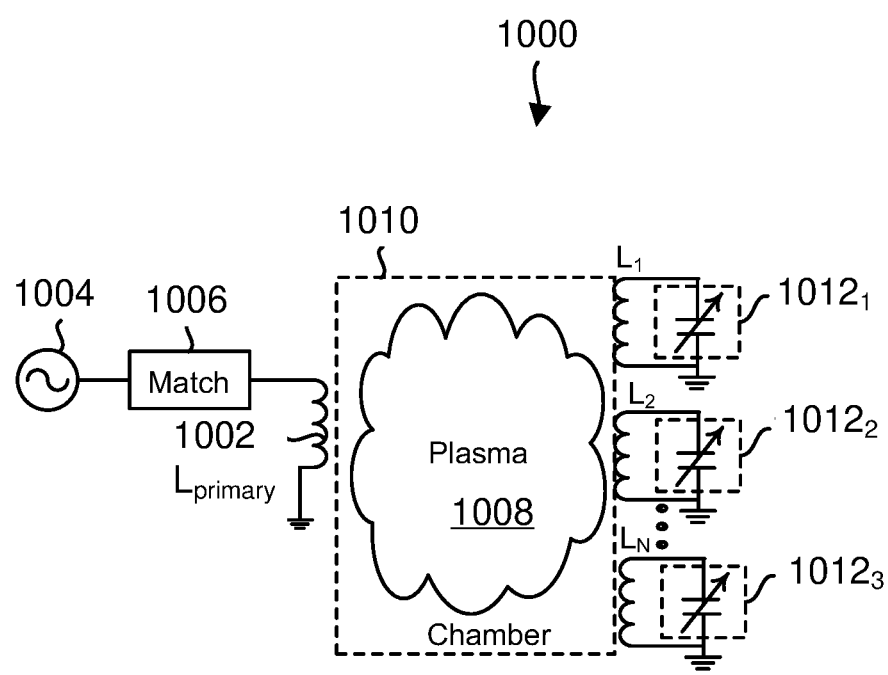
FIG. 10 is a block diagram depicting an exemplary embodiment of the disclosure.

FIG. 10 shows an inductively-coupled plasma processing system 1000 including a primary coil 1002 that is actively driven by a generator 1004 (via a match 1006) to ignite and sustain a plasma 1008 in a plasma processing chamber 1010. As depicted, the exemplary system 1000 includes N secondary coils $L_{1-N}$ that are inductively coupled to the plasma 1008, and the plasma 1008 is inductively coupled to the primary coil 1002. As a consequence, the secondary coils $L_{1-N}$ are inductively coupled to the primary coil 1002 via the plasma 1008 so that power is applied to the secondary coils $L_{1-N}$ by the plasma 1008. In some embodiments, the generator 1004 can be an example of the plant 308 in FIG. 3A, plant 357 in FIG. 3B, the plant 508 in FIG. 5, or the plant 906 in FIG. 9.

As depicted, coupled to each of the N secondary coils $L_{1-N}$ are a corresponding one of N passive elements $1012_{1-N}$, which passively terminate each of the N secondary coils $L_{1-N}$. This architecture is very different from known techniques that rely on actively driving each second coil $L_{1-N}$. Beneficially, because the secondary inductors are not actively driven, the secondary coils may be placed about the chamber 1010 with added ease and plasma spatial uniformity control is more conveniently achieved since the secondary inductors $L_{1-N}$ are driven by mutual coupling, through the plasma 1008, to the primary coil 1002, and as a consequence, lack the need for a direct power feed. Multiple secondary coils can be added in this manner beyond what is practical for adding multiple directly-powered secondary coils due to the inherent complexity and cost of additional powered feeds. Thus, plasma density may be manipulated in a more cost-effective manner.

In operation, power is applied through the match 1006 to the primary coil 1002, which effectively applies power to the chamber 1010, and once ignited, the plasma 1008 effectively operates as a secondary of a transformer, and the current that is induced in the plasma 1008 induces current in the secondary coils $L_{1-N}$. In turn, the current that is induced in the secondary coils $L_{1-N}$ induces current in the plasma 1008 and affects the density of the plasma 1008 in the regions proximate to each of the secondary coils $L_{1-N}$.

The N passive elements $1012_{1-N}$, depicted as variable capacitors in the exemplary embodiment, enable the current through each of the N coils $L_{1-N}$ to be regulated; thus enabling the ratio of current between the primary 1002 and the N secondary coils $L_{1-N}$ to be regulated. As a consequence, the plasma densities in regions proximate to each of the primary 1002 and secondary coils $L_{1-N}$ may be regulated.

The generator 1004 may be a 13.56 MHz generator, but this is certainly not required and other frequencies are certainly contemplated. And the match 1006 may be realized by a variety of match network architectures. As one of ordinary skill in the art will appreciate, the match 1006 is used to match the load of the plasma 1008 to the generator 1004. By correct design of the matching network 1006 (either internal to the generator or external as shown in FIG. 10), it is possible to transform the impedance of the load to a value close to the desired load impedance of the generator 1004.

Current in the primary coil 1002 and/or the secondary coils $L_{1-N}$ can be non-limiting examples of outputs that the MIMO controllers noted above consider. Plasma density or measurements that indicate local plasma density, such as current in secondary coils $L_{1-N}$, are other non-limiting examples of outputs that the MIMO controller can consider. Inputs that the MIMO controllers can consider include, but are not limited to, generator 1004 settings, settings of the match 1006, and settings of the N passive elements $1012_{1-N}$.

Although not shown, one or more intra-period controllers, such as 300, 350, or 500, can provide control for one or more of the generator 1004, the match 1006, and/or the N passive elements $1012_{1-N}$.

Figure 11A:
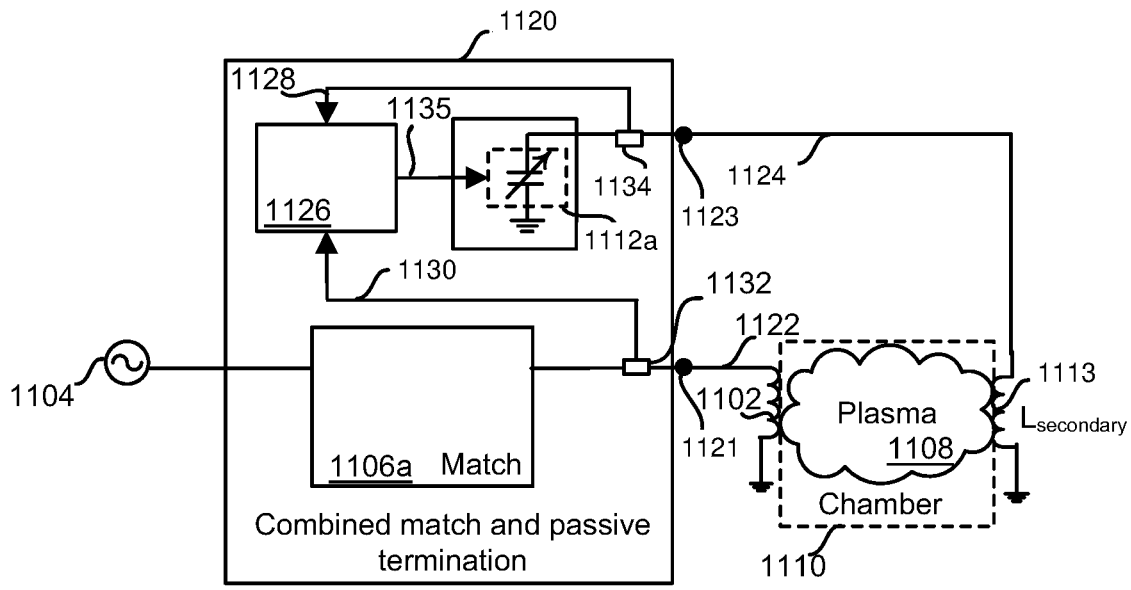
FIG. 11A is a block diagram depicting another exemplary embodiment of the disclosure.

Referring next to FIG. 11A, shown is an exemplary embodiment in which the passive element 1112a (e.g., variable capacitor) and the match 1106a are both positioned within the same housing 1120. As shown, at or near the housing 1120 is a primary terminal 1121 that is coupled to a first output conductor 1122 that couples the generator 1104 (through the match 1106a and primary terminal 1121) to a primary coil 1102. And a secondary terminal 1123, positioned at or near the housing 1120, is coupled to a second output conductor 1124 that couples a passive termination element 1112 and secondary terminal 1123 to a secondary coil 1113. In addition, a control portion 1126 (also referred to herein as a controller) (such as an inter-period controller as described in FIGS. 3-9) is disposed to receive signals 1128, 1130 indicative of current levels (which are indicative of the density of the plasma 1108 in the regions proximate to the coils 1102, 1113) in the first 1122 and second 1124 output conductors from first 1132 and second 1134 sensors (e.g., current transducers), respectively. And the control portion 1126 is also arranged to control a value (e.g., capacitance) of the passive element 1112a (e.g., variable capacitor).

In variations of the embodiment depicted in FIG. 11A, instead of current sensors 1132, 1134 (or in addition to current sensors 1132, 1134) other sensing components (either within or outside of the housing 1120) may be used to provide an indication of the plasma density in close proximity to the coils 1113. For example, optical sensors may be used to sense plasma properties (e.g., plasma density), or an eV source providing a substrate bias to the chamber 1110 may be used to sense plasma properties (e.g., plasma density and ion current).

It should be recognized that the depicted components in FIG. 11A are logical and not intended to form a hardware diagram. For example, the control portion 1126 and the sensors 1132, 1134 may each be realized by distributed components, and may be implemented by hardware, firmware, software or a combination thereof. In many variations of the embodiment depicted in FIG. 11A, the sensed current levels are converted to a digital representation, and the controller 1126 uses the digital representation of the current signals 1128, 1130 to generate a control signal 1135 to drive the passive element 1112a. In addition, the match 1106a may be controlled by the control portion 1126 or may be separately controlled.

It should also be recognized that, for simplicity, only one secondary coil 1113 and one passive termination element 1112a are depicted, but it is certainly contemplated that two or more secondary coils 1113 may be implemented in connection with two or more passive termination elements 1112a (e.g., two or more passive termination elements housed within housing 1120).

In operation, the generator 1104 applies power, through the match 1106a, to the primary coil 1102 and the current in the primary coil 1102 (which is sensed by the first sensor 1132) induces current in the plasma 1108, which in turn, induces current in the secondary coil 1113. And the current flowing through the secondary coil 1113, and hence the second output conductor 1124 and secondary terminal 1123, is sensed by the second sensor 1134. As discussed with reference to FIG. 10, unlike prior art implementations, the power that is applied by the secondary coil 1113 to the plasma 1108 is derived from current flowing through the primary coil 1102. More particularly, the secondary coil 1113 obtains power from the primary coil 1102 through the plasma 1108. In other words, there is no direct power source for the secondary coil 1113 other than mutual inductance through the plasma 1108.

The control portion 1126, sensors 1132, 1134, and passive element(s) 1112a collectively form a control system to control aspects of the plasma 1108 (e.g., the spatial distribution and density of the plasma 1108). The control portion 1126 in this embodiment is configured, responsive to the relative current levels in the primary 1102 and secondary 1113 coils, to alter the value (e.g., the capacitance) of the passive element 1112a (e.g., variable capacitor) so that the ratio of current between the primary 1102 and secondary 1113 coils is at a value that corresponds to a desired plasma density profile within the chamber 1110. Although not shown, the control portion 1126 may include a man-machine interface (e.g., display and input controls) to enable a user to receive feedback and facilitate control of the plasma 1108.

Current in the primary coil 1102 and/or the secondary coil 1113 are illustrative outputs of the MIMO controllers noted above. Plasma density or measurements that indicate local plasma density, such as current at sensors 1132, 1134, are other examples of outputs that the MIMO controller can consider. Inputs of the MIMO controllers can include, but are not limited to, settings of the generator 1104, settings of the match 1106a, and settings of the passive element(s) 1112a.

Although not shown, one or more intra-period controllers, such as 300, 350, or 500, can provide control for one or more of the generator 1104, the match 1106a, and/or the passive element(s), such as passive element 1113.

Figure 11B:
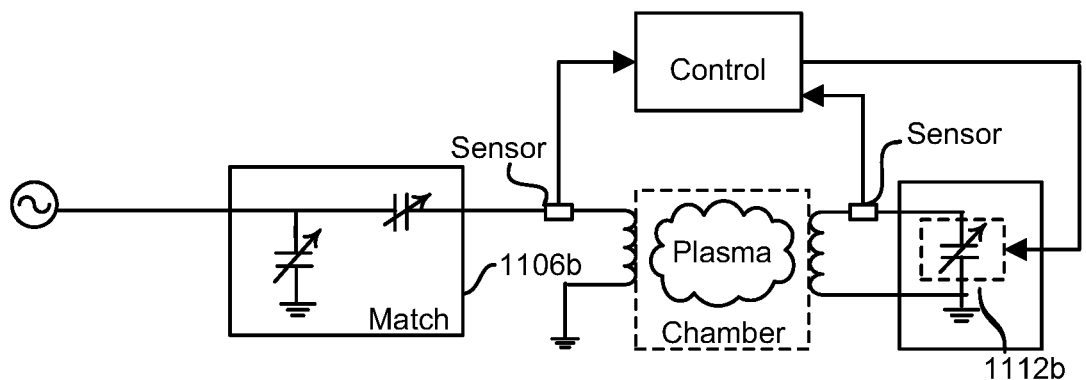
FIG. 11B is a block diagram depicting yet another embodiment of the disclosure.

Referring next to FIG. 11B, shown is another embodiment in which the passive termination element 1112b is implemented in a separate housing (separate from the match 1106b and controller) in close proximity with a chamber. The components in the present embodiment operate in a substantially similar manner as the components depicted in FIG. 11A, but the passive element 1112b may be implemented as a separate appliance or may be integrated with the chamber.

Current in the primary coil and/or the secondary coil can be outputs that the MIMO controller noted above considers. Plasma density or measurements that indicate local plasma density, such as current in secondary coil, are other examples of outputs that the MIMO controller can consider. Inputs that the MIMO controller can consider include, but are not limited to, the generator settings, settings of the variable capacitors in the match 1106b, and settings of the passive element 1112b.

Although not shown, one or more intra-period controllers, such as 300, 350, or 500, can provide control for one or more of the generator, the variable capacitors of the match 1106*b*, and/or the passive element 1112*b*.

Figure 12:
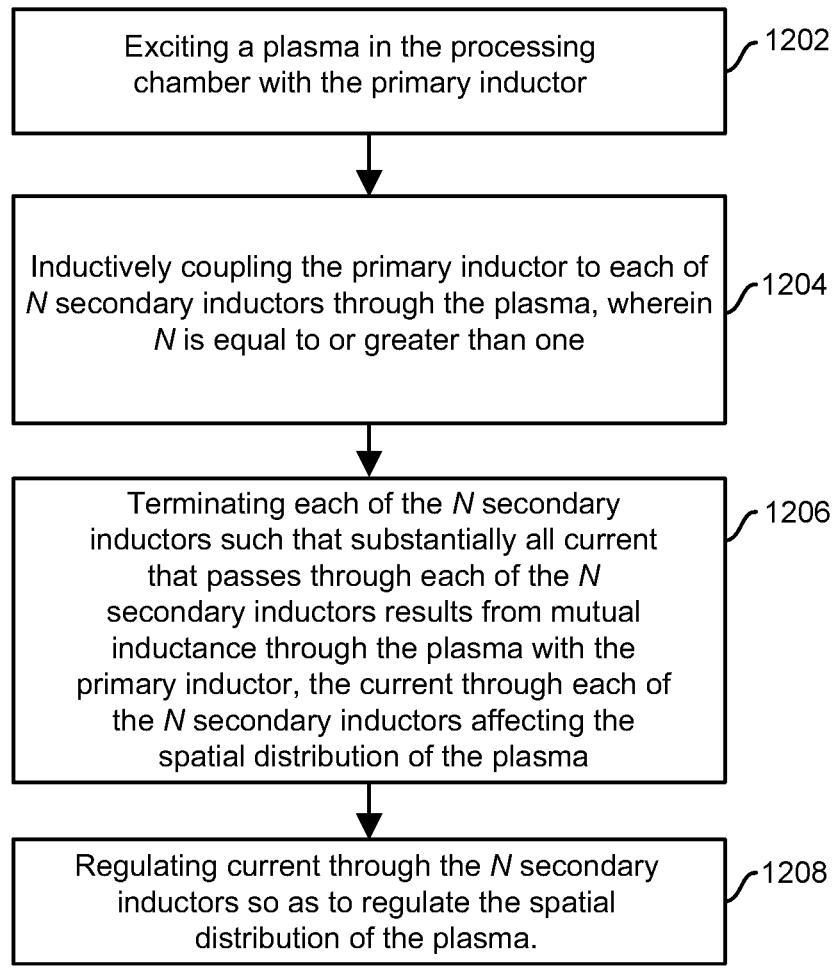
FIG. 12 is a flowchart depicting a method that may be traversed in connection with the embodiments described with reference to FIGS. 10-11.

Referring next to FIG. 12, it is a flowchart depicting steps that may be traversed in connection with the embodiments described with reference to FIGS. 10-11B for controlling the spatial distribution of plasma in a processing chamber (e.g., chamber 1008 and 1108). As depicted, when power is applied (e.g., directly applied by generator 1004, 1104 via match) to a primary inductor (e.g., the primary coil 1002, 1102), a plasma in the chamber is excited (Block 1202). In addition, the primary inductor is inductively coupled to each of N (N is equal to or greater than one) secondary conductors (e.g., secondary coils $L_{1-N}$ or $L_{secondary}$) through the plasma (Block 1204), and each of the N secondary inductors is terminated such that substantially all current that passes through each of the N secondary inductors results from mutual inductance through the plasma with the primary inductor (Block 1206). As previously discussed, the current through each of the N secondary inductors affects the spatial distribution of the plasma. Although not required, in some variations, the current through the N secondary inductors is regulated so as to regulate the spatial distribution of the plasma (Block 1208). For instance, the secondary inductors can be terminated via one or more variable elements, such as a variable reactance element, such as a variable capacitor. By adjusting the termination (e.g., a capacitance between the secondary inductor and ground), the method 1200 can locally control plasma density, with greater resolution or granularity of control enabled by using a greater number of secondary inductors.

In some embodiments, control of the method 1200 can utilize a MIMO controller, for instance using generator, match, and passive element settings as inputs and correlated with outputs such as current in the primary coil and current in the secondary coils.

Alternative Embodiments

In one embodiment, a power delivery system is disclosed comprising a generator and a controller. The generator can be configured to produce a power signal comprising a periodic repeating pattern produced over a period of time comprising a period of the power signal. The controller can be configured to control a current period of the periodic repeating pattern based on a measurement of the periodic repeating pattern taken in a period of the power signal prior to a current period of the power signal and a plurality of correlations between elements of multi-dimensional control input values to elements of multi-dimensional output values. The power signal may be configured to excite a plasma in a processing chamber via a primary inductor. The power delivery system may further comprise a means for inductively coupling the primary inductor to each of N secondary inductors through the plasma, where N is equal to or greater than one, and where current through each of the N secondary inductors is configured to affect the spatial distribution of the plasma.

The controller can be configured to control the periodic repeating pattern based on the measurement of the periodic repeating pattern taken in a period prior to the current period combined with a measurement of the periodic repeating pattern during a current period.

The generator can be configured to produce the periodic repeating pattern with a prescribed pattern wherein the prescribed pattern repeats with a repetition period, and wherein the measurement of the periodic repeating pattern taken in a period prior to the current period occurs one or more repetition periods in the past. The controller can also be configured to determine and use the correlations between the elements of the multi-dimensional control input values for a specific time period in the periodic repeating pattern and the elements of the multi-dimensional output values for the same specific time period. The controller can also be configured to perturb the control input to obtain the correlations between the elements of the multi-dimensional control input values and the elements of the multi-dimensional output values. The correlations between the elements of the multi-dimensional control input values for a specific time period in the periodic repeating pattern and time periods adjacent to the specific time period and the elements of the multi-dimensional output values for the specific time period can be determined and used by the controller. The correlations between the elements of the multi-dimensional control input values and the elements of the multi-dimensional output values can be determined by perturbing the control input and observing response to the perturbation. One element of the periodic repeating pattern can be one of voltage, current and power or combinations thereof and another element of the periodic repeating pattern can be one of impedance presented to the generator and source impedance of the generator. One element of the periodic repeating pattern can be one of voltage, current and power or combinations thereof and another element of the periodic repeating pattern is one of impedance presented to the generator and source impedance of the generator.

The generator can be one of a single radio frequency generator or a direct current generator, and the periodic repeating pattern is at least one of voltage, current, and power.

The generator can comprise a plurality of radio frequency generators, or a plurality of direct current generators, or a combination of radio frequency generators and direct current generators, and the periodic repeating pattern is at least one of voltage, current and power delivered to a plasma system.

In another embodiment, a power delivery system is disclosed having a generator, a controller, a primary inductor, and N secondary inductors. The generator can be configured to produce a power signal comprising a periodic repeating pattern produced over a period of time comprising a period of the power signal, the power signal configured to excite the plasma in the processing chamber via the primary inductor. The controller can be configured to control a current period of the periodic repeating pattern based on a plurality of correlations between elements of multi-dimensional control input values to elements of multi-dimensional output values, wherein the output values are measured in a period of the power signal prior to the current period. The N secondary inductors can have currents that are configured to spatially affect a distribution of the plasma. The power applied by the N secondary inductors can be substantially derived from current flowing through the primary coil.

The control system can be configured to combine measurements taken from one or more previous repetition periods with measurements taken from a current repetition period. The control system can be configured to produce and use the correlations between the plurality of control input elements of the multi-dimensional control input values at one instant of time relative to a start of the repetition period and a plurality of output elements of the multi-dimensional output values at the same instant of time relative to the start of the repetition period. The control system can be configured to perturb the control input and measure a response to the perturbation to produce the correlations between the control input elements of the multi-dimensional control input values and the output elements of the multi-dimensional output values. The control system is configured to determine and use the correlations between the plurality of control input elements of the multi-dimensional control input values at one instant of time relative to the start of the repetition period and at instances of time adjacent to the one instant of time and the output elements of the multi-dimensional output values at the one instant of time relative to the start of the repetition period. The control system can be configured to produce the correlations between the control input elements of the multi-dimensional control input values and the output elements of the multi-dimensional output values by perturbing the control input and measuring a response to the perturbation. The the power delivery system can comprise a single radio frequency (RF) or direct current (DC) generator and an element of the output comprises at least one of a voltage, a current, and a power level delivered to a plasma system. The power delivery system can comprise a plurality of generators each comprising a RF generator, a DC generator, or a combination of RF and DC generators and an element of each of an output of the plurality of generators comprises at least one of a voltage, a current, and a power level. One of the output elements of the output can comprise at least one of a voltage, a current, and a power, wherein another output element of the output can comprise at least one of a load impedance presented to a generator and a source impedance of the generator. One output element of the output can comprise at least one of a voltage, a current, and a power level, wherein another output element of the output can comprise at least one of a load impedance presented to a generator and a source impedance of the generator.

In one embodiment, a system for controlling a spatial distribution of plasma in a processing chamber is disclosed. The system can include a primary terminal, a secondary terminal, and a controller. The primary terminal can be configured to to couple to, and actively apply power to, a primary inductor of the plasma processing chamber. The secondary terminal can be configured to couple to a corresponding secondary inductor of the plasma processing chamber. Substantially all the current that passes through the secondary inductor results from mutual inductance through the plasma with the primary inductor. The controller can be configured to control a current period of a periodic repeating pattern of a power signal delivered to the primary terminal. The control can be based on a plurality of correlations between elements of multi-dimensional control input values to elements of multi-dimensional output values, wherein the output values are measured in a period of the power signal prior to the current period. In an embodiment, secondary terminal can be coupled to a terminating element, such as a variable capacitor or some other variable reactance element.

In another embodiment, a method for controlling a spatial distribution of plasma in a processing chamber that includes a primary inductor and N secondary inductors is disclosed. The method can include exciting the plasma in the processing chamber with the primary inductor; inductively coupling the primary inductor to each of N secondary inductors through the plasma, wherein N is equal to or greater than one; and terminating each of the N secondary inductors such that substantially all current that passes through each of the N secondary inductors results from mutual inductance through the plasma with the primary inductor, the current through each of the N secondary inductors affecting the spatial distribution of the plasma.

The terminating can include passively terminating each of the N secondary inductors. The method can further include regulating current through the N secondary inductors so as to regulate the spatial distribution of the plasma. The method can further include terminating each of the N secondary inductors with an impedance-adjustable termination element, and regulating current through the N secondary inductors includes regulating the current by adjusting an impedance of each of the impedance-adjustable termination elements. The method can also sense at least one parameter indicative of plasma density in regions proximal to the N secondary inductors, and adjust the impedance of the impedance-adjustable termination elements responsive to the sensing. The method can also sense current in each of the N secondary inductors, and adjust the impedance of the impedance-adjustable termination elements by adjusting a capacitance of the impedance-adjustable termination elements.

Another embodiment of the disclosure can be described as an apparatus for controlling the spatial distribution of plasma in a processing chamber, comprising a primary terminal, a secondary terminal, and a terminating element coupled to the secondary termina. The primary terminal can be configured to couple to, and actively apply power to, a primary inductor of the plasma processing chamber. The secondary terminal can be configured to couple to a corresponding secondary inductor of the plasma processing chamber. The terminating element can be disposed to provide a path for current flowing through the secondary inductive component, wherein substantially all the current that passes through the secondary inductor and the terminating element results from mutual inductance through the plasma with the primary inductor.

In conclusion, the present disclosure provides, among other things, a method, system, and apparatus that enables controllable plasma density with an actively driven coil and one or more passively terminated inductors using MIMO control. Those skilled in the art can readily recognize that numerous variations and substitutions may be made in the disclosure, its use, and its configuration to achieve substantially the same results as achieved by the embodiments described herein. Accordingly, there is no intention to limit the disclosure to the disclosed exemplary forms. Many variations, modifications, and alternative constructions fall within the scope and spirit of the disclosed disclosure.

What is claimed is:

1. A system for controlling a spatial distribution of plasma in a processing chamber comprising:
   a control system;
   a memory in communication with the control system;
   a primary inductor and N secondary inductors configured to be spaced apart by the plasma;
   wherein the control system is configured to:
      store a plurality of correlations between elements of multi-dimensional control input values to elements of multi-dimensional output values;
      control a current in the primary inductor based on the stored plurality of correlations between elements of multi-dimensional control input values to elements of multi-dimensional output values, wherein the plurality of correlations are taken from one or more previous periods of the current in the primary inductor, wherein the current in the primary inductor induces current in the N secondary inductors, and where current in the N secondary inductors is configured to spatially affect a distribution of the plasma.

2. The system of claim 1, wherein each of the N secondary inductors is coupled to an impedance-adjustable, passive terminating element.

3. The system of claim 2, further comprising:
   means for sensing at least one parameter indicative of plasma density in regions proximal to the N secondary inductors, and means for adjusting the impedance of the impedance-adjustable, passive terminating elements responsive to the sensing.

4. The system of claim 1, further comprising means for sensing current in each of the N secondary inductors, and means for adjusting a capacitance of the impedance-adjustable, passive terminating elements.

5. A system for controlling a spatial distribution of plasma in a processing chamber comprising:
   a primary inductor configured to receive a power signal comprising a periodic repeating pattern produced over a period of time comprising a period of the power signal, the power signal configured to excite the plasma in the processing chamber via the primary inductor;
   a controller configured to control a current period of the periodic repeating pattern based on a plurality of correlations between elements of multi-dimensional control input values to elements of multi-dimensional output values, wherein the output values are measured in a period of the power signal prior to the current period; and
   means for inductively coupling the primary inductor to each of N secondary inductors through the plasma, where N is equal to or greater than one, and where current through each of the N secondary inductors is configured to affect the spatial distribution of the plasma.

6. The system of claim 5, further comprising means for terminating each of the N secondary inductors such that current that passes through each of the N secondary inductors results from mutual inductance through the plasma with the primary inductor.

7. The system of claim 6, wherein the means for terminating each of the N secondary inductors comprises means for passively terminating each of the N secondary inductors.

8. The system of claim 6, wherein the means for terminating comprises an impedance-adjustable, passive terminating element so as to enable currents through the N secondary inductors to be adjusted.

9. The system of claim 8, wherein the controller is configured to adjust an impedance of the impedance-adjustable, passive terminating element responsive to a signal that is indicative of the spatial distribution of the plasma.

10. The system of claim 5, further comprising means for regulating current through the N secondary inductors so as to regulate the spatial distribution of the plasma.

11. The system of claim 10, wherein the means for terminating each of the N secondary inductors comprises means for terminating each of the N secondary inductors with an impedance-adjustable termination element, and the means for regulating current through the N secondary inductors comprises means for adjusting an impedance of each of the impedance-adjustable termination elements.

12. The system of claim 5, wherein the N secondary inductors do not have a direct power feed.

13. The system of claim 5, wherein each of the N secondary inductors are coupled to a variable reactance element and adjustment of the variable reactance element affects the spatial distribution of the plasma.

14. The system of claim 5, wherein one of the multi-dimensional output values is a measure of plasma density in proximity to each of the N secondary inductors.

15. A system for controlling a spatial distribution of plasma in a processing chamber comprising:
   a plasma processing chamber to contain a plasma;
   a generator that produces a power signal that modulates plasma properties of the plasma with a periodic modulation pattern that repeats with a repetition period;
   an impedance matching network coupled between the plasma processing chamber and the generator;
   a primary coil; and
   N secondary coils having currents configured to spatially affect a distribution of the plasma and where power applied by the N secondary coils to the plasma is substantially derived from current flowing through the primary coil; and
   control means operably coupled to the impedance matching network, the control means comprising means for controlling a variable impedance element in the impedance matching network based on a measurement indicative of a load impedance taken one or more repetition periods of the periodic modulation pattern in the past and a plurality of correlations between elements of multi-dimensional control input values to elements of multi-dimensional output values.

16. The system of claim 15, further comprising a terminating element coupled to each of the N secondary coils such that current in the N secondary coils is derived from mutual inductance through the plasma with the primary coil.

17. The system of claim 16, wherein the terminating element is an impedance-adjustable, passive terminating element.

18. The system of claim 16, further comprising:
   the control means further comprising means to control an impedance of the impedance-adjustable, passive terminating element responsive to at least one signal indicative of the distribution of the plasma.

19. The system of claim 16, wherein the terminating element comprises a variable capacitor.

20. The system of claim 16, wherein the elements of multi-dimensional output values comprise at least a current in the primary coil and currents in the N secondary coils.

* * * * *